United States Patent
Wang et al.

(10) Patent No.: US 11,376,577 B2
(45) Date of Patent: Jul. 5, 2022

(54) PHOTOCATALYTIC STRUCTURE AND METHOD FOR MAKING THE SAME

(71) Applicants: Tsinghua University, Beijing (CN); HON HAI PRECISION INDUSTRY CO., LTD., New Taipei (TW)

(72) Inventors: Ying-Cheng Wang, Beijing (CN); Yuan-Hao Jin, Beijing (CN); Xiao-Yang Xiao, Beijing (CN); Tian-Fu Zhang, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/380,242

(22) Filed: Apr. 10, 2019

(65) Prior Publication Data
US 2020/0238265 A1    Jul. 30, 2020

(30) Foreign Application Priority Data

Jan. 25, 2019    (CN) .......................... 201910075219.0

(51) Int. Cl.
*B01J 35/00* (2006.01)
*B01J 21/06* (2006.01)
(Continued)

(52) U.S. Cl.
CPC .......... *B01J 35/004* (2013.01); *B01J 21/063* (2013.01); *B01J 37/0215* (2013.01); *B32B 3/26* (2013.01);
(Continued)

(58) Field of Classification Search
CPC ..... Y10T 428/24479; Y10T 428/24521; Y10T 428/24537; Y10T 428/24545;
(Continued)

(56) References Cited

U.S. PATENT DOCUMENTS 6,228,480 B1    5/2001    Kimura et al.
2014/0183141 A1*   7/2014   Kurup .................... B01J 35/002
                                                      210/748.09

(Continued)

FOREIGN PATENT DOCUMENTS

CN    1188428    7/1998
CN    104334773    2/2015
(Continued)

OTHER PUBLICATIONS

Hannink, R.H.J. Hill, A.J.. (2006). Nanostructure Control of Materials—1.1 Introduction. Woodhead Publishing. Retrieved from app.knovel.com/hotlink/pdf/id:kt007CO3T2/nanostructure-control/nanoparticle-introduction (Year: 2006).*

(Continued)

*Primary Examiner* — Maria V Ewald
*Assistant Examiner* — Ethan A. Utt
(74) *Attorney, Agent, or Firm* — ScienBiziP, P.C.

(57) ABSTRACT

The disclosure relates to a photocatalytic structure. The photocatalytic structure includes a substrate, a photocatalytic active layer, and a metal layer. The substrate, the photocatalytic active layer, and the metal layer are arranged in succession. The substrate includes a base and a patterned bulge layer on a surface of the base. The patterned bulge layer is a net-like structure comprising a plurality of strip-shaped bulges intersected with each other and a plurality of indents defined by the plurality of strip-shaped bulges. The plurality of strip-shaped bulges is an integrated structure. The photocatalytic active layer is on the surface of the (Continued)

patterned bulge layer. The metal layer includes a plurality of nanoparticles located on the surface of the photocatalytic active layer away from the substrate.

17 Claims, 25 Drawing Sheets

(51) Int. Cl.
    *B32B 3/26*     (2006.01)
    *B32B 15/04*     (2006.01)
    *B32B 9/04*     (2006.01)
    *B32B 9/00*     (2006.01)
    *B01J 21/18*     (2006.01)
    *B01J 37/02*     (2006.01)
    *C23C 14/34*     (2006.01)
    *C23C 14/02*     (2006.01)
    *C23C 14/58*     (2006.01)
    *C23C 14/08*     (2006.01)
    *C23C 16/56*     (2006.01)
    *C23C 16/455*     (2006.01)
    *C23C 16/02*     (2006.01)
    *C23C 16/40*     (2006.01)
(52) U.S. Cl.
    CPC .............. *B32B 9/007* (2013.01); *B32B 9/04* (2013.01); *B32B 15/04* (2013.01); *C23C 14/021* (2013.01); *C23C 14/083* (2013.01); *C23C 14/34* (2013.01); *C23C 14/58* (2013.01); *B01J 21/185* (2013.01); *C23C 16/0254* (2013.01); *C23C 16/405* (2013.01); *C23C 16/45525* (2013.01); *C23C 16/56* (2013.01)
(58) Field of Classification Search
    CPC ....... Y10T 428/2457; Y10T 428/24579; Y10T 428/24587; Y10T 428/24612; Y10T 428/2462; Y10T 428/24802; Y10T 428/24893; Y10T 428/24909; Y10T 428/24917; Y10T 428/24926; Y10T 428/25; Y10T 42/256; Y10T 428/31678; Y10T 428/31681; Y10T 428/31692; Y10T 428/31699; Y10T 428/31663; Y10T 428/31721; Y10T 428/31786; Y10T 428/31855; Y10T 428/31935; Y10T 428/12; Y10T 428/12014; Y10T 428/12028; Y10T 428/12049; Y10T 428/12056; Y10T 428/12389; Y10T 428/1241; Y10T 428/12417; Y10T 428/12493; Y10T 428/12535; Y10T 428/12556; Y10T 428/12562; Y10T 428/12569; Y10T 428/12576; Y10T 428/12583; Y10T 428/1259; Y10T 428/12597; Y10T 428/12611; Y10T 428/12771; Y10T 428/12778; Y10T 428/12861; Y10T 428/12882; Y10T 428/12889; Y10T 428/12896; Y10T 428/12903; Y10T 428/1291; Y10T 428/12917; Y10T 428/12924; Y10T 428/12931; Y10T 428/12937; Y10T 428/12944; Y10T 428/12951; Y10T 428/12958; Y10T 428/12965; Y10T 428/12972; Y10T 428/12979; Y10T 428/24628; Y10T 428/24669; Y10T 428/24678; Y10T 428/30; B32B 3/00; B32B 3/10; B32B 3/12; B32B 3/14; B32B 3/16; B32B 3/26; B32B 3/263; B32B 3/28; B32B 3/30; B32B 5/00; B32B 5/16; B32B 15/00; B32B 15/04; B32B 15/043; B32B 15/06; B32B 15/08; B32B 15/082; B32B 15/09; B32B 15/18; B32B 15/20; B32B 17/00; B32B 17/06; B32B 17/061; B32B 17/064; B32B 17/067; B32B 17/10; B32B 27/00; B32B 27/06; B32B 27/08; B32B 27/12; B32B 27/14; B32B 27/283; B32B 27/30; B32B 27/308; B32B 27/36; B32B 33/00; B01J 35/00; B01J 35/002; B01J 35/004; B01J 21/00; B01J 21/06; B01J 21/063; B01J 21/066; B01J 23/00; B01J 23/06; B01J 23/14; B01J 23/48; B01J 23/50; B01J 23/52; B01J 23/54; B01J 23/66; B01J 23/70; B01J 23/72; B01J 23/74; B01J 23/745; B01J 23/755; B01J 23/76; B01J 23/80; B01J 23/835; B01J 23/89; B01J 23/8906; B01J 23/892; B01J 23/8926; B01J 23/8933; B01J 23/8953; B01J 23/8966; Y10S 977/70; Y10S 977/701; Y10S 977/707; Y10S 977/712; Y10S 977/715; Y10S 977/72; Y10S 977/721; Y10S 977/722; Y10S 977/723; Y10S 977/755; Y10S 977/773; Y10S 977/775; Y10S 977/777; Y10S 977/81; Y10S 977/811; Y10S 977/832; Y10S 977/834; Y10S 977/835; Y10S 977/902; Y10S 977/903; Y10S 977/932; Y10S 977/948; B82B 1/00; B82B 1/005; B82B 1/008; B82Y 30/00; B82Y 40/00
    USPC ....... 428/156, 161, 163, 164, 167, 168, 169, 428/172, 173, 195.1, 206, 208, 209, 210, 428/323, 328, 457, 458, 461, 463, 469, 428/471, 426, 432, 433, 434, 446, 447, 428/450, 473.5, 480, 500, 522, 544, 546, 428/548, 551, 552, 603, 604, 615, 621, 428/624–630, 632, 655, 656, 668, 428/671–685, 174, 179, 180, 408; 502/300, 325, 326, 328–331, 337, 338, 502/340, 343–345, 347, 350, 352; 977/700, 701, 707, 712, 715, 720–723, 977/755, 773, 775, 777, 810, 811, 832, 977/834, 835, 902, 903, 932, 948
See application file for complete search history.

(56) References Cited

U.S. PATENT DOCUMENTS

| | | | |
|---|---|---|---|
| 2015/0083605 A1 | 3/2015 | Tamura et al. | |
| 2016/0139511 A1 | 5/2016 | Li et al. | |
| 2016/0160364 A1* | 6/2016 | Juluri | ............... C01B 3/042 205/91 |
| 2016/0340233 A1* | 11/2016 | Jin | ............... B32B 15/08 |
| 2017/0170172 A1* | 6/2017 | Cheng | ............ H01L 21/823437 |
| 2018/0003639 A1* | 1/2018 | Jin | ............... G01N 21/658 |

FOREIGN PATENT DOCUMENTS

| | | |
|---|---|---|
| CN | 106390998 | 2/2017 |
| CN | 107561051 | 1/2018 |
| CN | 207153717 U | 3/2018 |
| CN | 108855061 | 11/2018 |
| JP | 2017101289 | 6/2017 |
| TW | 201619044 | 6/2016 |

(56) References Cited

OTHER PUBLICATIONS

Tatsuya Hatanaka et al. "PEFC Electrodes Based on Vertically Oriented Carbon Nanotubes", The Electrochemical Society, 3(1), 2006, pp. 277-284.

* cited by examiner

US 11,376,577 B2

PHOTOCATALYTIC STRUCTURE AND METHOD FOR MAKING THE SAME

This application claims all benefits accruing under 35 U.S.C. § 119 from China Patent Application No. 201910075219.0, filed on Jan. 25, 2019, in the China National Intellectual Property Administration, the disclosure of which is incorporated herein by reference. This application is related to applications entitled, "PHOTOCATALYTIC STRUCTURE AND METHOD FOR MAKING THE SAME", filed ****.

BACKGROUND

1. Technical Field

The present disclosure relates to a photocatalytic structure, and a method for making the same.

2. Description of Related Art

The photocatalyst can produce electron-hole pairs with strong reducibility and oxidation under the irradiation of incident light whose energy is higher than the band gap energy of the photocatalyst. These electron-hole pairs can react with substance adsorbed on the surface of the photocatalyst. Potential applications of photocatalysis are mainly in the following areas: photolysis of water to produce hydrogen, artificial photosynthesis, photooxidation or decomposition of harmful substances, photoelectrochemical conversion and photo-induced superhydrophilicity.

As a photocatalyst, titanium dioxide has the advantages of good acid resistance, non-toxicity to organisms and large resource reserves. Titanium dioxide is a promising material for the applications in areas such as photocatalysis and photoelectric conversion. But a large band gap energy of titanium dioxide limits the practical applications in natural solar light. Developing forms of titanium dioxide which are responsive to visible light is one of the most important subjects in research and development. Moreover, the absorption capacity of titanium dioxide to ultraviolet light is limited, and the utilization of ultraviolet light can not reach 100%. Therefore, a lot of research and development efforts have been devoted to modifying titanium dioxide to improve its utilization of sunlight.

Photoelectrocatalysis refers to fixing the photocatalyst on a conductive metal. While the photocatalyst on the conductive metal acts as a working electrode, photogenerated electrons are forced to move toward the counter electrode by applying a constant current or a constant potential. As such, electrons and holes are separated.

What is needed, therefore, is an improved photocatalytic structure.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
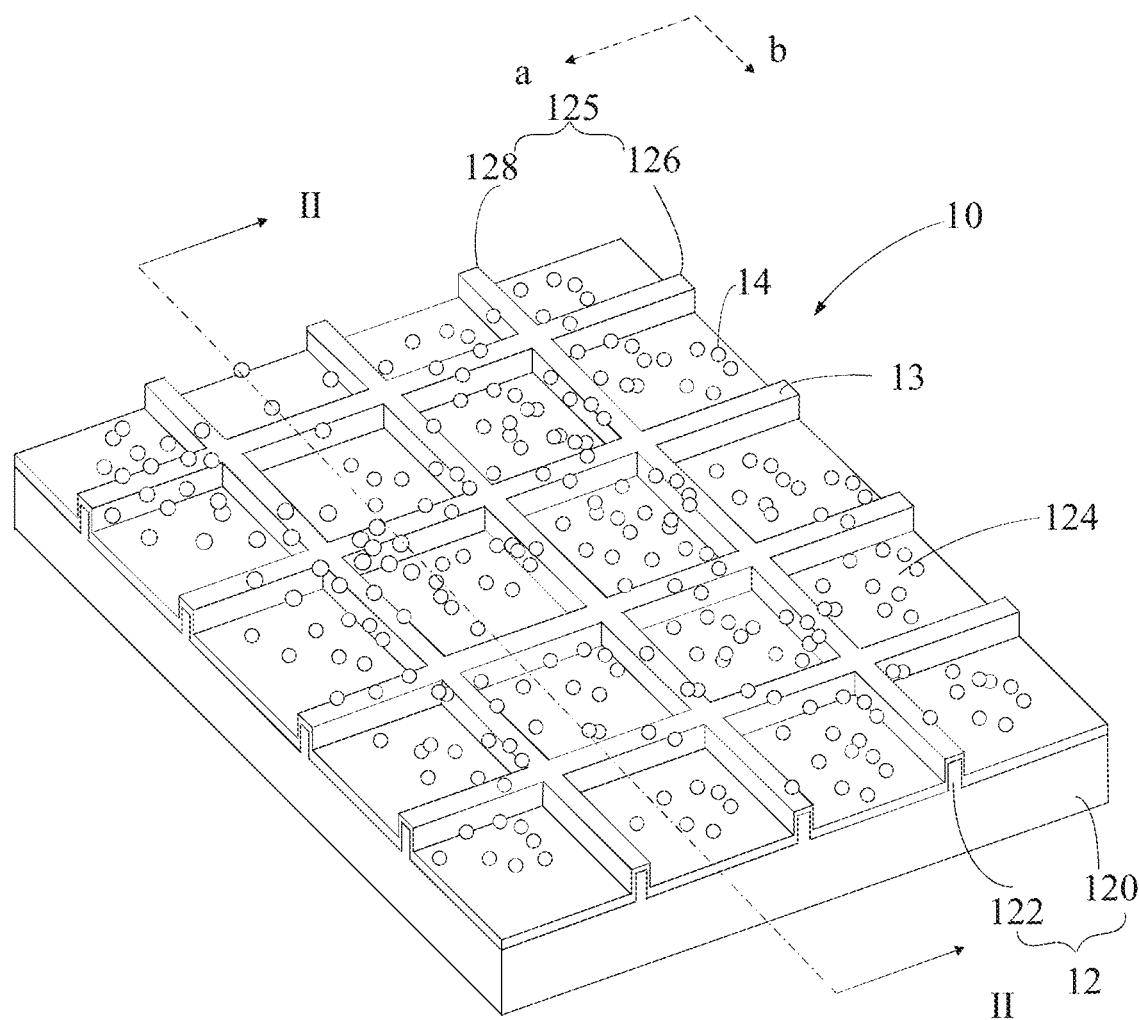
FIG. 1 is a schematic section view of one embodiment of a photocatalytic structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated better illustrate details and features. The description is not considered as limiting the scope of the embodiments described herein.

Several definitions that apply throughout this disclosure will now be presented. The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present photocatalytic structure, a method for making the same.

Figure 2:
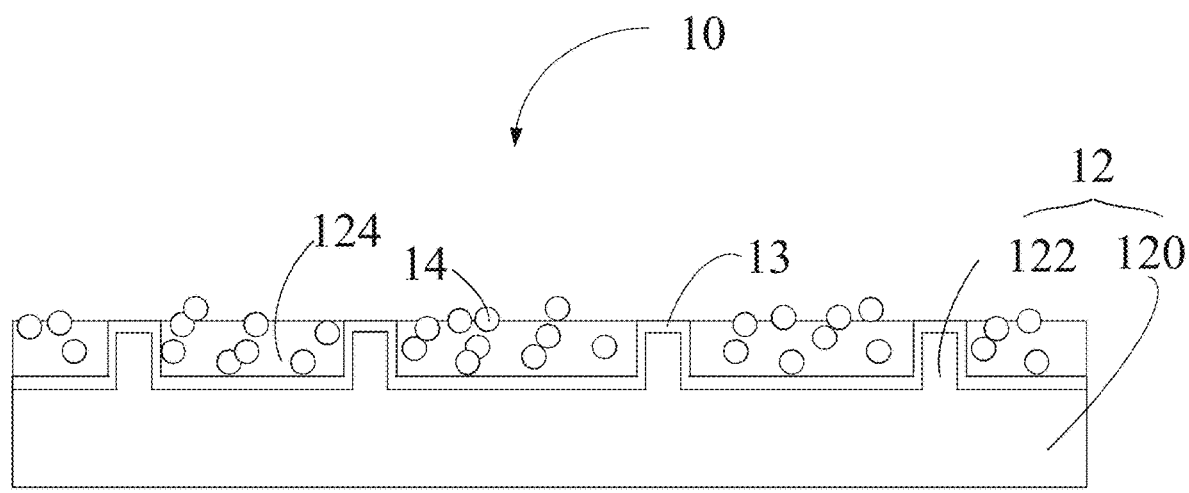
FIG. 2 is a cross-sectional view, along a line II-II of FIG. 1.

Referring to FIGS. 1-2, a photocatalytic structure 10 of one embodiment is provided. The photocatalytic structure 10 comprises a substrate 12, a photocatalytic active layer 13 on the substrate 12, and a metal layer 14 on the photocatalytic active layer 13 away from the substrate 12. The substrate 12 comprises a base 120 and a patterned bulge layer 122 on a surface of the base 120. The patterned bulge layer 122 is a net-like structure comprising a plurality of strip-shaped bulges 125 intersected with each other. A plurality of indents 124 are defined on the base 120 by the plurality of strip-shaped bulges 125. The plurality of strip-shaped bulges 125 is an integrated structure. The photocatalytic active layer 13 is on the surface of the patterned bulge layer 122. The photocatalytic active layer 13 covers both the plurality of strip-shaped bulges 125 and the plurality of indents 124. The metal layer 14 comprises a plurality of nanoparticles on the surface of the photocatalytic active layer 13 away from the substrate 12.

The substrate 12 can be a flexible substrate or a hard substrate. The hard substrate can be an insulative substrate, a semiconductor substrate or a metal substrate. The hard substrate can be made of a material such as glass, quartz, silicon (Si), silicon dioxide ($SiO_2$), silicon nitride ($Si_3N_4$), gallium nitride (GaN), gallium arsenide (GaAs), alumina ($Al_2O_3$), magnesia (MgO), iron (Fe), copper (Cu), titanium (Ti), chromium (Cr), aluminum (Al) or zinc (Zn). When the material of the substrate 12 is metal, the photocatalytic structure 10 can be used as working electrodes of a photo-electrocatalytic structure. The working electrode combined with a counter electrode and a reference electrode can be assembled into a photoelectrocatalytic reactor. The photogenerated electrons are forced to move toward the counter electrode by applying a constant current or a constant potential. Therefore, photogenerated electrons and holes are separated, which decrease recombinations of photogenerated charge carriers. The substrate 12 which is flexible can make the photocatalytic structure 10 have flexibility, so that the photocatalytic structure 10 can be attached to a curved surface. Specifically, the material of the substrate 12 can be polyethylene terephthalate (PET), polyimide (PI), polymethyl methacrylate (PMMA), polydimethylsiloxane (PDMS), or polyethylene naphthalate (PEN), etc. A shape, a size and a thickness of the substrate 12 are not limited and can be selected according to applications. In one embodiment, the substrate 12 is a quartz wafer.

The patterned bulge layer 122 and the base 120 can be made of same material or different materials. In one embodiment, the patterned bulge layer 122 and the base 120 are an integrated structure. The patterned bulge layer 122 can be located on a single surface or two opposite surfaces of the base 120. Each of the plurality of strip-shaped bulges 125 has a length less than or equal to the width or the length of the base 120. It means that the plurality of strip-shaped bulges 125 can cover the whole surface of base 120 or part of the surface of the base 120. If the 125 cover the whole surface of the base 120, the length of the plurality of strip-shaped bulges 125 extending along the length direction is equal to the length of the base 120, and the length of the plurality of strip-shaped bulges 125 extending along the width direction is equal to the width of the base 120. If the 125 cover part of the surface of the base 120, the length of the plurality of strip-shaped bulges 125 extending along the length direction is less than the length of the base 120, and the length of the plurality of strip-shaped bulges 125 extending along the width direction is less than the width of the base 120. The plurality of strip-shaped bulges 125 comprises a plurality of first strip-shaped bulges 126 and a plurality of second strip-shaped bulges 128. The plurality of first strip-shaped bulges 126 are substantially parallel with each other and extends along the first direction, and the plurality of second strip-shaped bulges 128 are substantially parallel with each other and extends along the second direction different from the first direction. Referring to FIG. 1, the first direction is the 'a' direction and the second direction is the 'b' direction. An angle between the first direction and the second direction is greater than 0 degrees and less than or equal to 90 degrees. In one embodiment, the angle between the first direction and the second direction is greater than 30 degrees. In one embodiment, the angle between the first direction and the second direction is about 90 degrees.

A length of each of the plurality of strip-shaped bulges 125 can be selected according to need. A width of each of the plurality of strip-shaped bulges 125 ranges from about 20 nanometers to about 150 nanometers. In one embodiment, the width of the plurality of strip-shaped bulges 125 ranges from about 50 nanometers to about 100 nanometers. A distance between adjacent parallel two of the plurality of strip-shaped bulges 125 ranges from about 50 nanometers to about 500 nanometers. In one embodiment, the distance between adjacent two of the plurality of strip-shaped bulges 125 ranges from about 50 nanometers to about 300 nanometers. In one embodiment, the distance between adjacent two of the plurality of strip-shaped bulges 125 ranges from about 50 nanometers to about 100 nanometers. A height of the plurality of strip-shaped bulges 125 ranges from about 50 nanometers to about 2000 nanometers. In one embodiment, the height of the plurality of strip-shaped bulges 125 ranges from about 300 nanometers to about 1000 nanometers. The average size of the plurality of indents 124 ranges from about 50 nanometers to about 500 nanometers, and the depth of the plurality of indents 124 ranges from about 50 nanometers to about 2000 nanometers. The size of the plurality of indents 124 refers to a maximum diagonal length of the plurality of indents 124. In one embodiment, the ratio between the depth and the average size is greater than 5. In one embodiment, the ratio between the depth and the average size is greater than 10.

The photocatalytic active layer 13 can be located on both top and side surfaces of the plurality of strip-shaped bulges 125 and bottom surfaces of the plurality of indents 124. The material of photocatalytic active layer 13 can be titanium dioxide ($TiO_2$), zinc oxide (ZnO), tin oxide ($SnO_2$), zirconium dioxide ($ZrO_2$), cadmium sulfide (CdS) and other oxide or sulfide semiconductors. The material of the photocatalytic active layer 13 comprises at least one of the above materials. The titanium dioxide is available in three crystal structures-anatase, rutile and slate. Only the anatase titanium dioxide and rutile titanium dioxide have photocatalytic activity. In one embodiment, the material of the photocatalytic active layer 13 is anatase titanium dioxide.

The metal layer 14 is located on the surface of the photocatalytic active layer 13 away from the substrate 12. The metal layer 14 can be a continuous structure and cover the entire surface of the photocatalytic active layer 13. The metal layer 14 can also be a discontinuous structure. The metal layer 14 can be a single-layer or a multi-layer structure. Surface plasmon resonance exists on the surface of metal layer 14 at the indents 124 to enhance the absorption of visible light. The localized surface plasmon resonance effect produced by the metal layer 14 can make the excited thermal electrons cross the conduction band of the photocatalytic active layer 13, inhibit the recombination probability of photogenerated electron-hole pairs in the photocatalytic active layer 13, and increase the number of free electrons in the conduction band of the photocatalytic active layer 13.

The thickness of the metal layer 14 ranges from about 2 nanometers to about 200 nanometers. The material of the metal layer 14 is a metal material with surface plasmon effect. The material of the metal layer 14 can be gold, silver, copper, iron, nickel, aluminum, or any alloy thereof. The metal layer 14 can be uniformly deposited on the surface of the photocatalytic active layer 13 by a method of electron beam evaporation, chemical vapor deposition (CVD), or sputtering. In one embodiment, the metal layer 14 is a gold layer with a thickness of about 8 nanometers.

Figure 3:
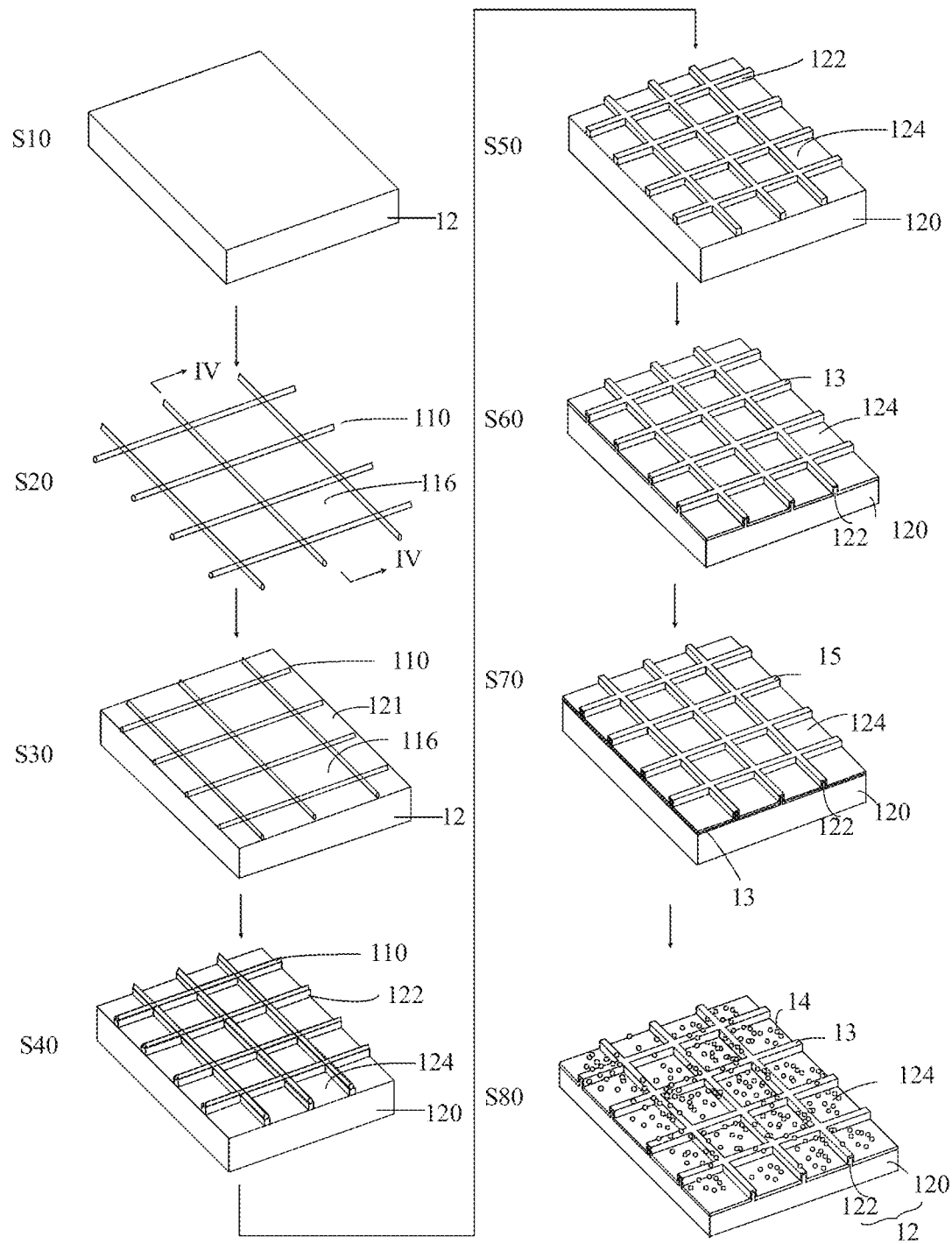
FIG. 3 is a flowchart of one embodiment of a method for making the photocatalytic structure of FIG. 1.
Figure 4:
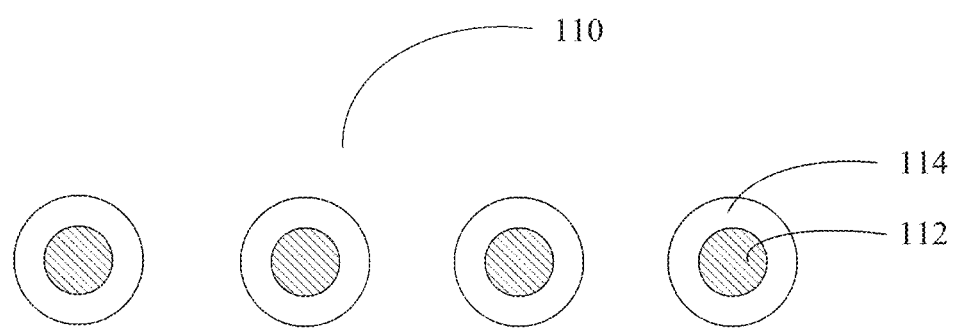
FIG. 4 is a cross-sectional view along line IV-IV of a carbon nanotube composite structure of FIG. 3.

Referring to FIG. 3 and FIG. 4, a method for making the photocatalytic structure 10 of one embodiment comprises the following steps:

step (S10), providing a substrate 12;

step (S20), providing a carbon nanotube composite structure 110, wherein the carbon nanotube composite structure 110 includes a plurality of intersected carbon nanotubes and defines a plurality of openings 116;

step (S30), placing the carbon nanotube composite structure 110 on a surface 121 of the substrate 12, wherein parts of the surface 121 are exposed from the plurality of openings 116;

step (S40), forming the patterned bulge layer 122 on the surface 121 by dry etching the surface 121 using the carbon nanotube composite structure 110 as a mask, wherein the patterned bulge layer 122 includes a plurality of strip-shaped bulges 125 intersected with each other;

step (S50), removing the carbon nanotube composite structure 110;

step (S60), applying a photocatalytic active layer 13 on the patterned bulge layer 122;

step (S70), applying a metal layer pre-form 15 on the surface of the photocatalytic active layer 13 away from the substrate 12; and step (S80), forming the metal layer 14 by annealing the metal layer pre-form 15.

In step (S10), the material of the substrate 12 is not limited and can be metal, insulating material or semiconductor. The metal can be gold, aluminum, nickel, chromium, or copper. The insulating material can be silicon dioxide or silicon nitride. The semiconductor can be silicon, gallium nitride, or gallium arsenide. In one embodiment, the material of the substrate 12 is a quartz wafer with a thickness of 500 micrometers.

In step (S20), the carbon nanotube composite structure 110 includes a carbon nanotube structure 112 and a protective layer 114 coated on the carbon nanotube structure 112 as shown in FIG. 4. The carbon nanotube structure 112 is a free-standing structure. The term "free-standing structure" includes that the carbon nanotube structure 112 can sustain the weight of itself when it is hoisted by a portion thereof without any significant damage to its structural integrity. Thus, the carbon nanotube structure 112 can be suspended by two spaced supports.

The plurality of carbon nanotubes can be single-walled carbon nanotubes, double-walled carbon nanotubes, or multi-walled carbon nanotubes. The length and diameter of the plurality of carbon nanotubes can be selected according to need. The diameter of the single-walled carbon nanotubes ranges from about 0.5 nanometers to about 10 nanometers. The diameter of the double-walled carbon nanotubes ranges from about 1.0 nanometer to about 15 nanometers. The diameter of the multi-walled carbon nanotubes ranges from about 1.5 nanometers to about 50 nanometers. A length of the carbon nanotubes is larger than 50 micrometers. In one embodiment, the length of the carbon nanotubes ranges from about 200 micrometers to about 900 micrometers.

The plurality of carbon nanotubes are orderly arranged to form an ordered carbon nanotube structure. The plurality of carbon nanotubes extend along a direction substantially parallel to the surface of the carbon nanotube structure 112. The largest surface of the carbon nanotube structure 112 is formed by arranging the plurality of carbo nanotubes substantially parallel in the surface. The term 'ordered carbon nanotube structure' includes, but is not limited to, a structure wherein the plurality of carbon nanotubes are arranged in a consistently systematic manner, e.g., the plurality of carbon nanotubes are arranged approximately along the same direction.

The carbon nanotube structure 112 defines a plurality of apertures. The aperture penetrates through the thickness direction of the carbon nanotube structure 112. The aperture can be a hole defined by several adjacent carbon nanotubes, or a gap defined by two substantially parallel carbon nanotubes and extending along axial direction of the carbon nanotubes. The hole shaped aperture and the gap shaped aperture can co-exist in the carbon nanotube structure 112. Hereafter, the size of the aperture is a maximum diagonal length of the hole or width of the gap. The sizes of the apertures can be different. The average size of the apertures ranges from about 10 nanometers to about 500 micrometers. For example, the sizes of the apertures can be about 50 nanometers, 100 nanometers, 500 nanometers, 1 micrometer, 10 micrometers, 80 micrometers, or 120 micrometers.

The carbon nanotube structure 112 can include at least one carbon nanotube film, at least one carbon nanotube wire, or combination thereof. In one embodiment, the carbon nanotube structure 112 can include a single carbon nanotube film or two or more carbon nanotube films stacked together. Thus, the thickness of the carbon nanotube structure 112 can be controlled by the number of the stacked carbon nanotube films. The number of the stacked carbon nanotube films ranges from about 2 to about 100. For example, the number of the stacked carbon nanotube films can be 2, 3, or 4. In one embodiment, the carbon nanotube structure 112 is formed by folding a single carbon nanotube wire. In one embodiment, the carbon nanotube structure 112 can include a layer of parallel and spaced carbon nanotube wires. Also, the carbon nanotube structure 112 can include a plurality of carbon nanotube wires intersected or weaved together to form a carbon nanotube net. The distance between two adjacent parallel and spaced carbon nanotube wires ranges from about 0.1 micrometers to about 200 micrometers. In one embodiment, the distance between two adjacent parallel and spaced carbon nanotube wires is in a range from about 10 micrometers to about 100 micrometers. The gap between two adjacent substantially parallel carbon nanotube wires is defined as the apertures. The size of the apertures can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 5:
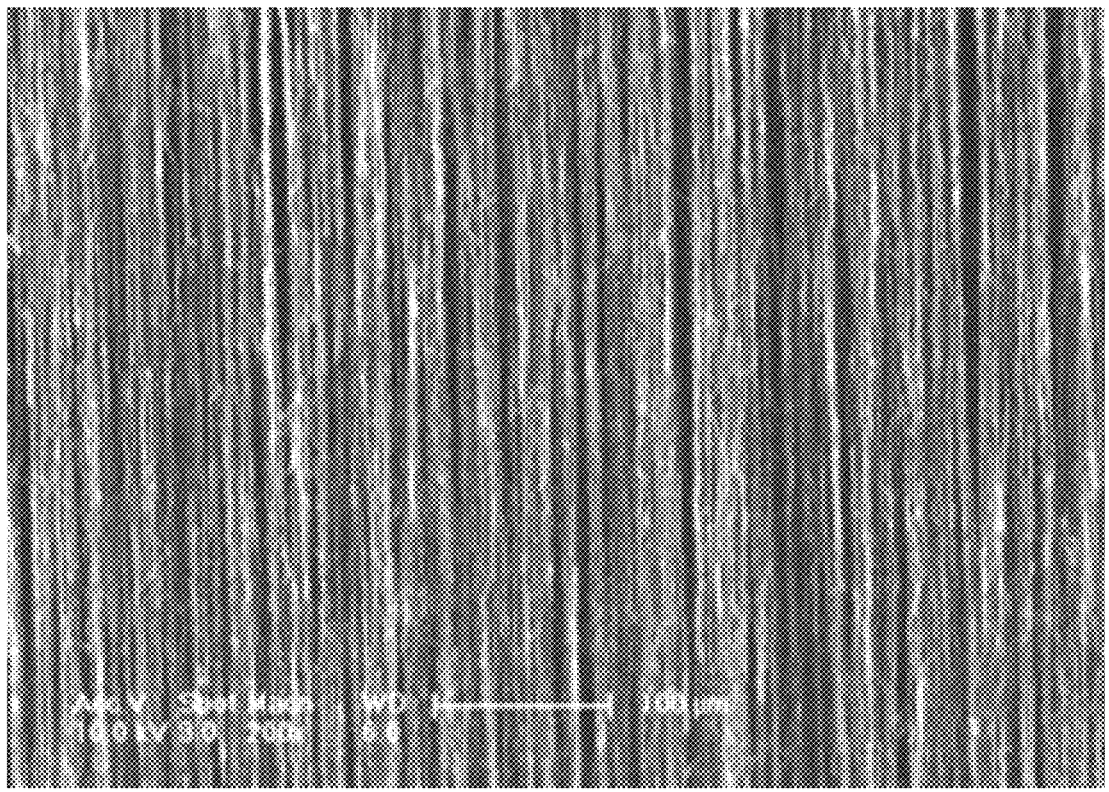
FIG. 5 is a scanning electron microscopy (SEM) image of a drawn carbon nanotube film of one embodiment.

In one embodiment, the carbon nanotube structure 112 includes at least one drawn carbon nanotube film. For example, the number of the drawn carbon nanotube films can be 2, 3, or 4. The drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a freestanding film. Referring to FIG. 5, each drawn carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. As can be seen in FIG. 5, some variations can occur in the drawn carbon nanotube film. The carbon nanotubes in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers. The drawn carbon nanotube film defines a plurality of apertures between adjacent carbon nanotubes.

The carbon nanotube structure 112 can include at least two stacked drawn carbon nanotube films. In other embodiments, the carbon nanotube structure 112 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micro pores is defined by the carbon nanotube structure 112. In one embodiment, the carbon nanotube structure 112 has the aligned directions of the carbon nanotubes between adjacent stacked drawn carbon nanotube films at 90 degrees. Stacking the carbon nanotube films will also add to the structural integrity of the carbon nanotube structure 112.

Figure 6:
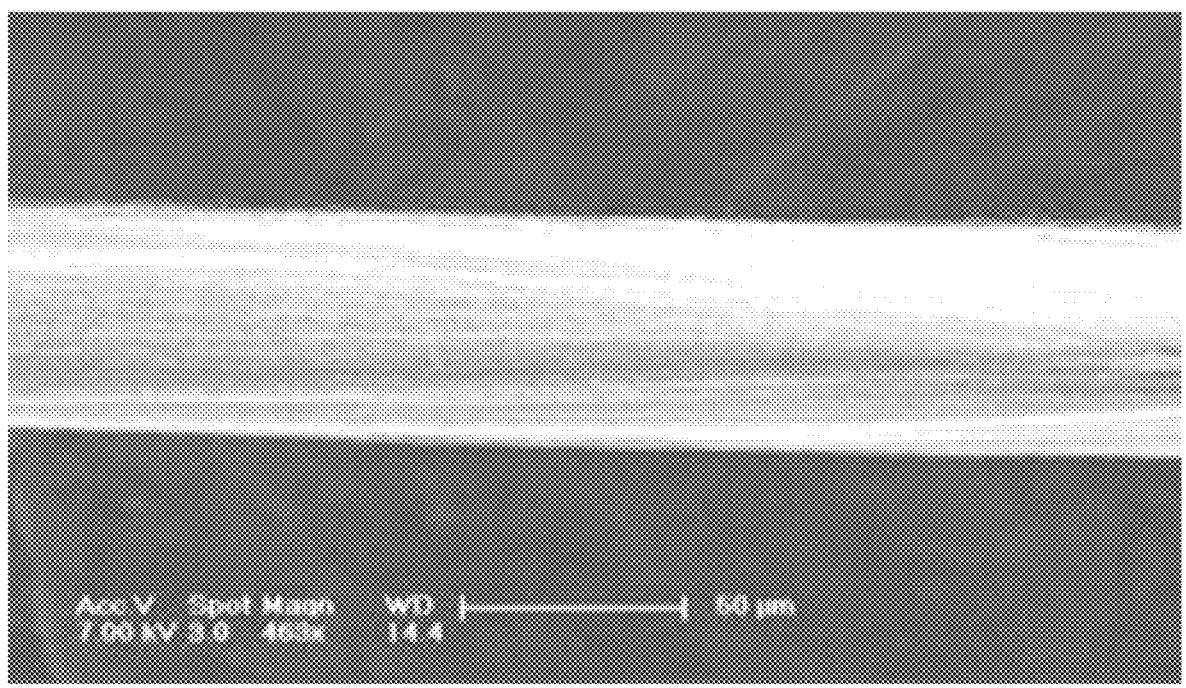
FIG. 6 is a SEM image of an untwisted carbon nanotube wire of one embodiment.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. Referring to FIG. 6, the untwisted carbon nanotube wire includes a plurality of carbon nanotubes substantially oriented along the same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

Figure 7:
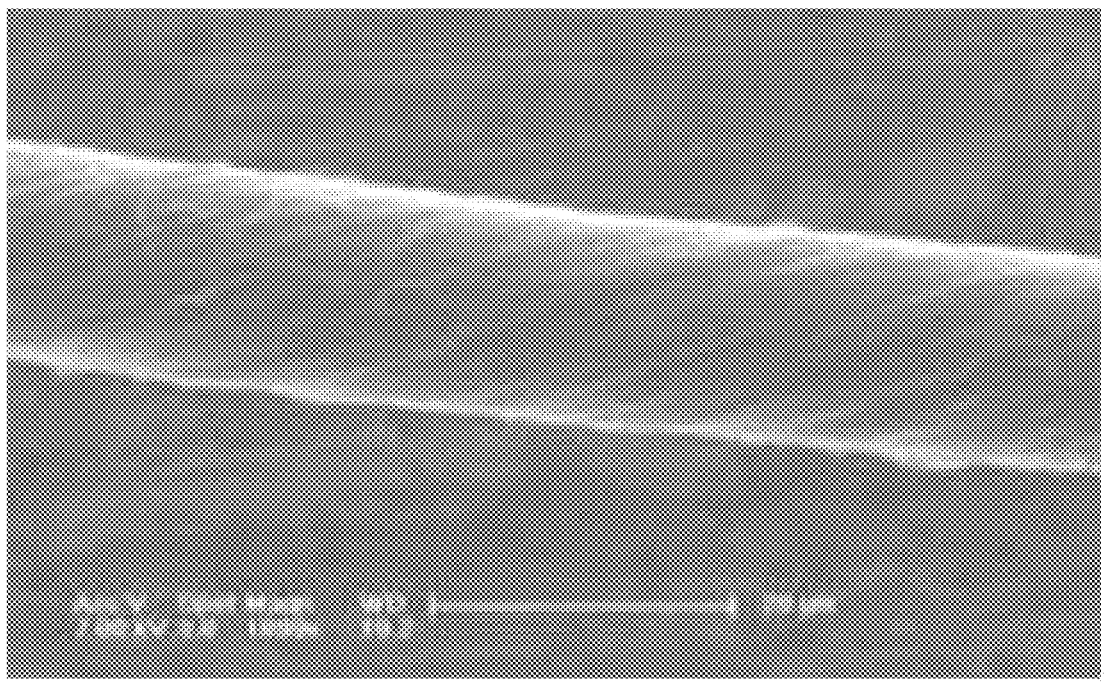
FIG. 7 is a SEM image of a twisted carbon nanotube wire of one embodiment.

The twisted carbon nanotube wire can be formed by twisting a drawn carbon nanotube film using a mechanical force to turn the two ends of the drawn carbon nanotube film in opposite directions. Referring to FIG. 7, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent paralleled carbon nanotubes together. The specific surface area of the twisted carbon nanotube wire will decrease, while the density and strength of the twisted carbon nanotube wire will increase.

The carbon nanotube composite structure 110 can be made by applying a protective layer 114 on a surface of the carbon nanotube structure 112. The carbon nanotube structure 112 can be suspended in a depositing chamber during depositing the protective layer 114 so that two opposite surfaces of the carbon nanotube structure 112 are coated with the protective layer 114. In some embodiments, each of the plurality of carbon nanotubes is fully enclosed by the protective layer 114. In one embodiment, the carbon nanotube structure 112 is located on a frame so that the middle portion of the carbon nanotube structure 112 is suspended through the through hole of the frame. The frame can be any shape, such as a quadrilateral. The carbon nanotube structure 112 can also be suspended by a metal mesh or metal ring.

The method of depositing the protective layer 114 can be physical vapor deposition (PVD), chemical vapor deposition (CVD), atomic layer deposition (ALD), magnetron sputtering, or spraying.

The plurality of openings 116 are formed from the plurality of apertures of the carbon nanotube structure 112. The plurality of openings 116 have a shape and a size corresponding to the plurality of apertures. The size of the plurality of openings 116 is smaller than that of the plurality of apertures because the protective layer 114 is deposited in the plurality of apertures.

The thickness of the protective layer 114 is in a range from about 3 nanometers to about 50 nanometers. In one embodiment, the thickness of the protective layer 114 is in a range from about 3 nanometers to about 20 nanometers. If the thickness of the protective layer 114 is less than 3 nanometers, the protective layer 114 cannot prevent the carbon nanotubes from being destroyed in following etching process. If the thickness of the protective layer 114 is greater than 50 nanometers, the plurality of apertures may be fully filled by the protective layer 114 and the plurality of openings 116 cannot be obtained.

The material of the protective layer 114 can be metal, metal oxide, metal nitride, metal carbide, metal sulfide, silicon oxide, silicon nitride, or silicon carbide. The metal can be gold, nickel, titanium, iron, aluminum, titanium, chromium, or alloy thereof. The metal oxide can be alumina, magnesium oxide, zinc oxide, or hafnium oxide. The material of the protective layer 114 is not limited above and can be any material as long as the material can be deposited on the carbon nanotube structure 112, would not react with the carbon nanotubes and would not be etched easily in following drying etching process. The protective layer 114 is combined with the carbon nanotube structure 112 by van der Waals attractive force therebetween only.

Figure 8:
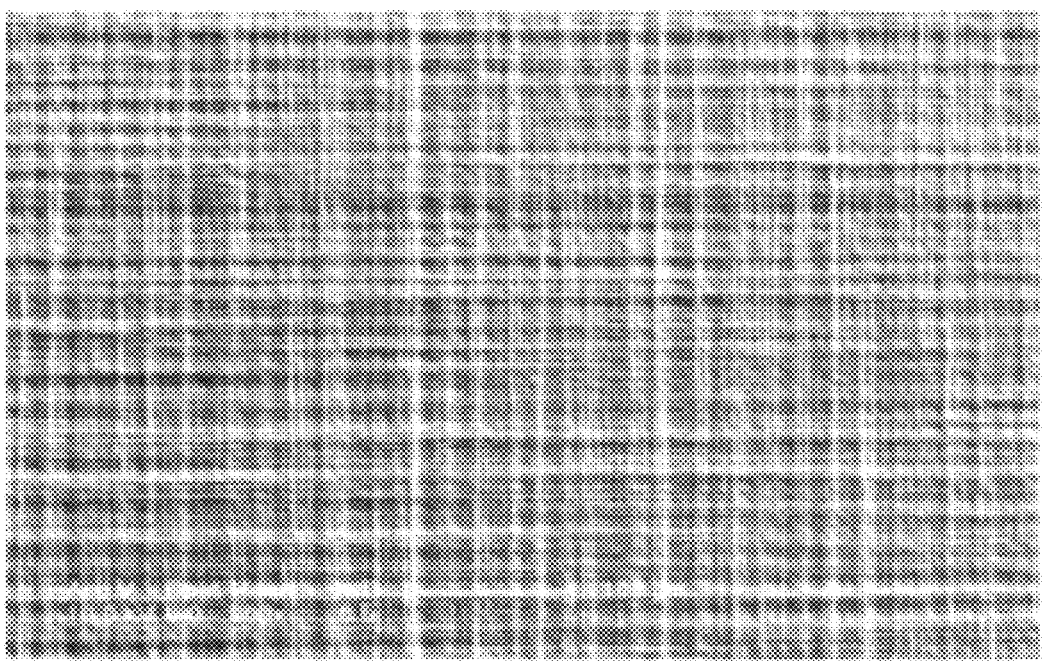
FIG. 8 is a SEM image of a carbon nanotube composite structure of one embodiment.
Figure 9:
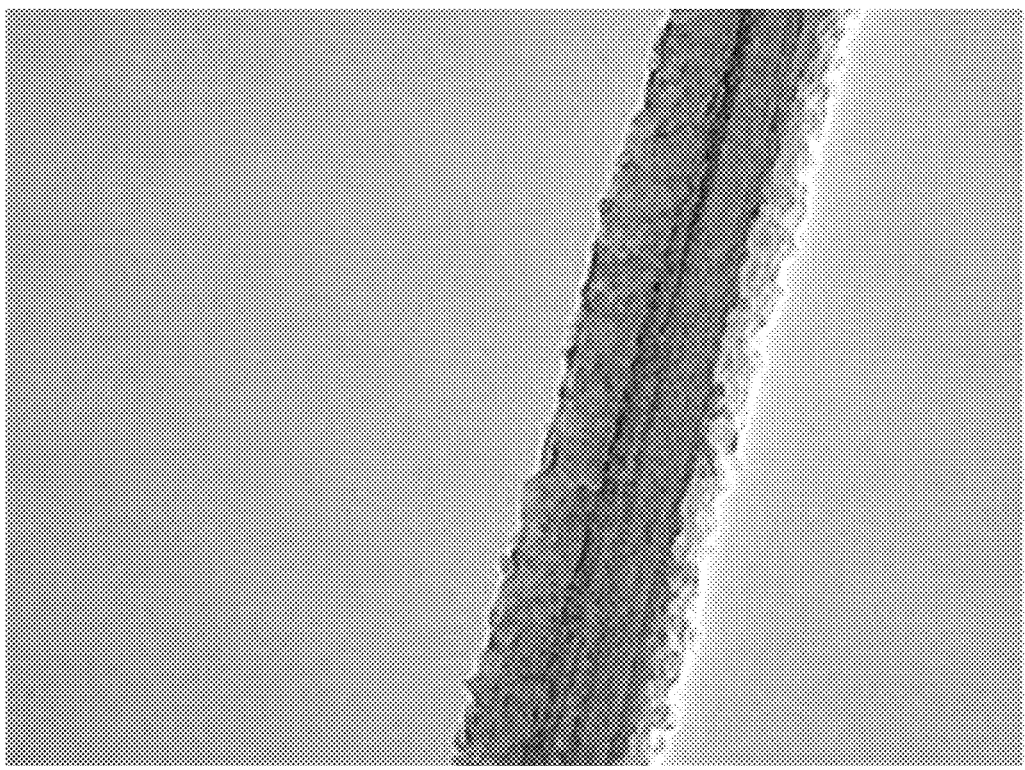
FIG. 9 is a SEM image of a single carbon nanotube coated with an alumina ($Al_2O_3$) layer.

As shown in FIG. 8, in one embodiment, an alumina layer of 20 nanometers thickness is deposited on two stacked drawn carbon nanotube films by electron beam evaporation. As shown in FIG. 9, each of the carbon nanotubes is entirely coated by the alumina layer. The aligned direction of the carbon nanotubes between adjacent stacked drawn carbon nanotube films is 90 degrees.

In step (S30), the carbon nanotube composite structure 110 can be in direct contact with the surface 121 of the substrate 12 or suspended above the surface 121 of the substrate 12 by a support. In one embodiment, the carbon nanotube composite structure 110 is transferred on the surface 121 of the substrate 12 through the frame.

In one embodiment, the placing the carbon nanotube composite structure 110 on the surface 121 further comprises solvent treating the substrate 12 with the carbon nanotube composite structure 110 thereon. Because air is entrapped between the carbon nanotube composite structure 110 and the surface 121 of the substrate 12, the solvent treating can exhaust the air and allow the carbon nanotube composite structure 110 to be closely and firmly adhered on the surface 121 of the substrate 12. The solvent treating can be applying a solvent to entire surface of the carbon nanotube composite structure 110 or immersing the entire substrate 12 with the carbon nanotube composite structure 110 in a solvent. The solvent can be water or volatile organic solvent such as ethanol, methanol, acetone, dichloroethane, chloroform, or mixtures thereof. In one embodiment, the organic solvent is ethanol.

In step (S40), the dry etching can be plasma etching or reactive ion etching (RIE). In one embodiment, the dry etching is performed by applying plasma energy on the entire or part surface of the surface 121 via a plasma device. The plasma gas can be an inert gas and/or etching gases, such as argon (Ar), helium (He), chlorine ($Cl_2$), hydrogen ($H_2$), oxygen ($O_2$), fluorocarbon ($CF_4$), ammonia ($NH_3$), or air.

In one embodiment, the plasma gas is fluorocarbon. The power of the plasma device ranges from about 20 watts to about 70 watts. The plasma flow of fluorocarbon ranges from about 10 sccm to about 60 sccm, such as 40 sccm. When the plasma is produced in vacuum, the work pressure of the plasma ranges from about 1 Pa to 10 Pa, such as 2 Pa. The time for plasma etching ranges from about 20 seconds to about 300 seconds, such as 200 seconds.

In the plasma etching process, the plasma gas would react with the exposed portion of the substrate 12 and would not react with the protective layer 114, or reaction between the plasma gas and the protective layer 114 is much slower than reaction between the plasma gas and the substrate 12. The selection relationship of the plasma gas, material of the substrate 12 and material of the protective layer 114 is shown in Table 1 below.

TABLE 1

| Number | Subtrate | Protective layer | Plasma gas |
|---|---|---|---|
| 1 | Al | $SiO_2$ | $Cl_2$ or $BCl_3$ |
| 2 | $SiO_2$ | Al, Cr, Fe, Ti, Ni, Au or $Al_2O_3$ | $CF_4$ |
| 3 | $SiN_x$ | Al, Cr, Fe, Ti, Ni, or Au | $CF_4$ |
| 4 | GaN | $Al_2O_3$ | $Cl_2$ or $Ar_2$ |
| 5 | Au·Cr or Ni | $SiO_2$, or $SiN_x$ | $O_2$ or $Ar_2$ |
| 6 | Cu | $SiO_2$, or $SiN_x$ | $O_2$ or $BCl_3$ |

In the etching process, the etching gas reacts with the substrate 12, but does not react with the protective layer 114 or react with the protective layer 114 at a speed much less than that of the reaction between the etching gas and the substrate 12. Thus, the exposed portion of the substrate 12 would be etched gradually and the portion of the substrate 12 that are shielded by the carbon nanotube composite structure 110 would not be etched.

Figure 11:
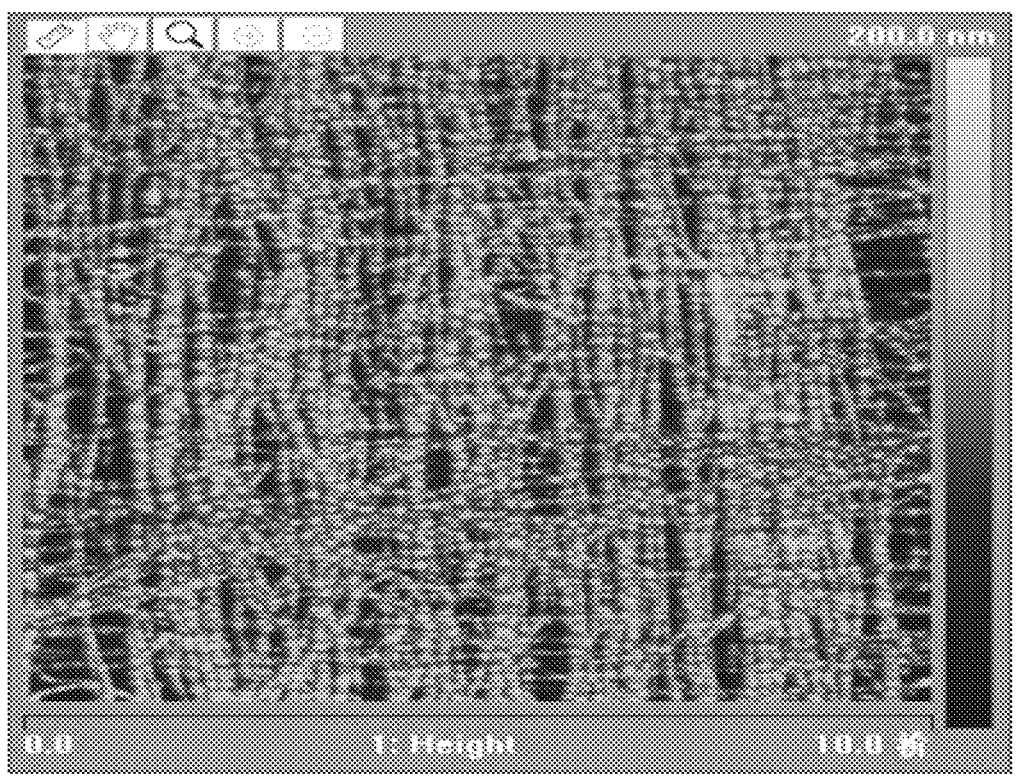
FIG. 11 is an Atomic Force Microscope (AFM) image of the photocatalytic structure made by the method of FIG. 3. The carbon nanotube structure includes two intersected stacked drawn carbon nanotube films, and the substrate is etched once.
Figure 12:
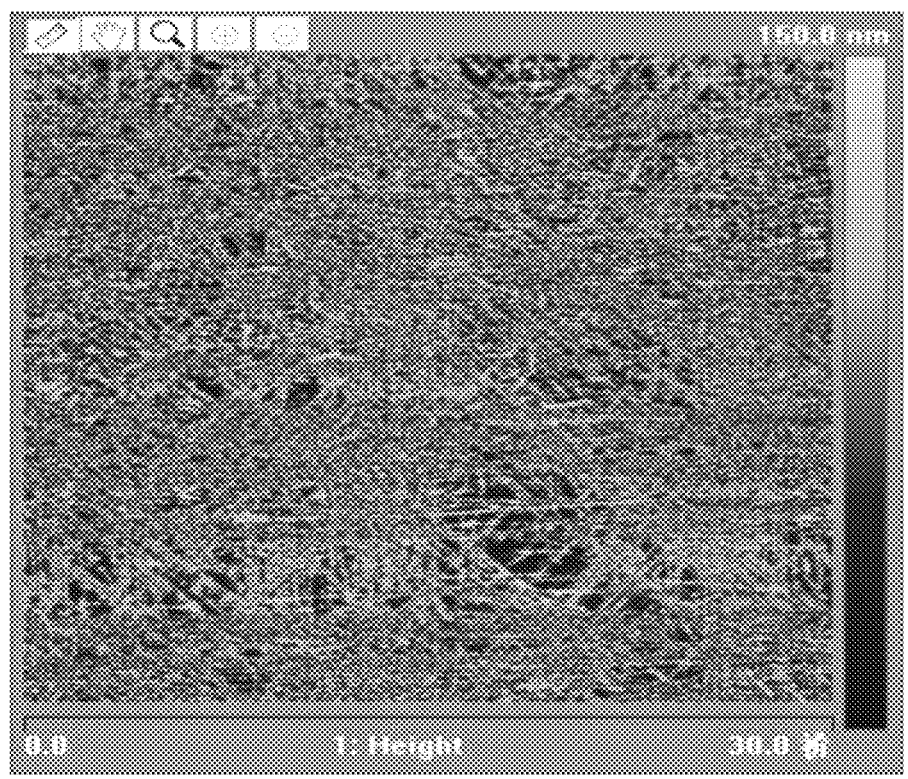
FIG. 12 is an AFM image of the photocatalytic structure made by the method of FIG. 3. The carbon nanotube structure includes two intersected stacked drawn carbon nanotube films, and the substrate is etched twice.
Figure 13:
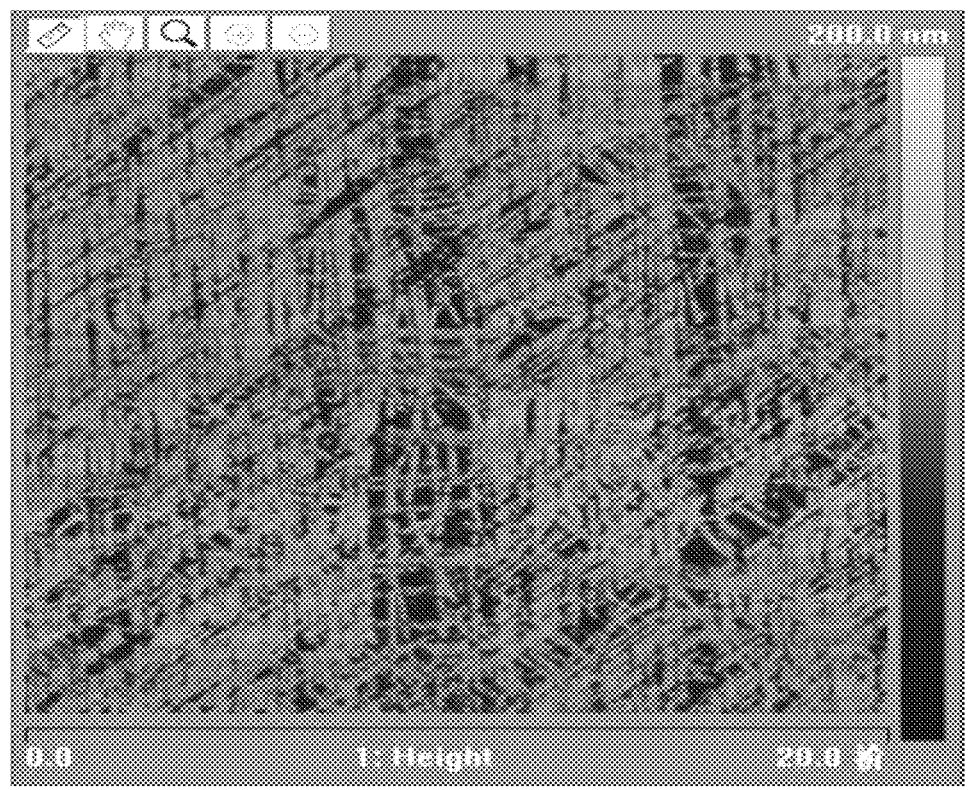
FIG. 13 is an AFM image of the photocatalytic structure made by the method of FIG. 3. The carbon nanotube structure includes four intersected stacked drawn carbon nanotube films, and the substrate is etched once.

The patterned bulge layer 122 and the carbon nanotube composite structure 110 substantially have the same pattern. When the carbon nanotube structure 112 includes a plurality of intersected drawn carbon nanotube films, the patterned bulge layer 122 includes a plurality of strip-shaped bulges 125 intersected with each other to form a net structure as shown in FIG. 11 to FIG. 13. An angle between the aligned directions of the carbon nanotubes in two adjacent stacked drawn carbon nanotube films is less than 0 degrees and larger than or equal to 90 degrees. The aligned directions of the carbon nanotubes in any two drawn carbon nanotube films are different. In one embodiment, the carbon nanotube structure 112 includes two intersected stacked drawn carbon nanotube films. The angle between the aligned directions of the carbon nanotubes in the two adjacent stacked drawn carbon nanotube films is about 90 degrees. In another embodiment, the carbon nanotube structure 112 includes four intersected stacked drawn carbon nanotube films. The angle between the aligned directions of the carbon nanotubes in any two adjacent stacked drawn carbon nanotube films is about 45 degrees and the aligned directions of the carbon nanotubes in any two drawn carbon nanotube films are different from each other.

Figure 10A:
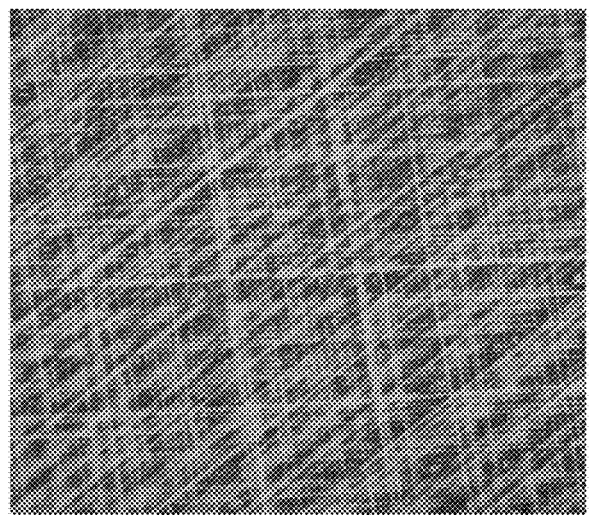
FIG. 10A is a SEM image of a substrate etched once with two intersected stacked drawn carbon nanotube films as a mask.
Figure 10B:
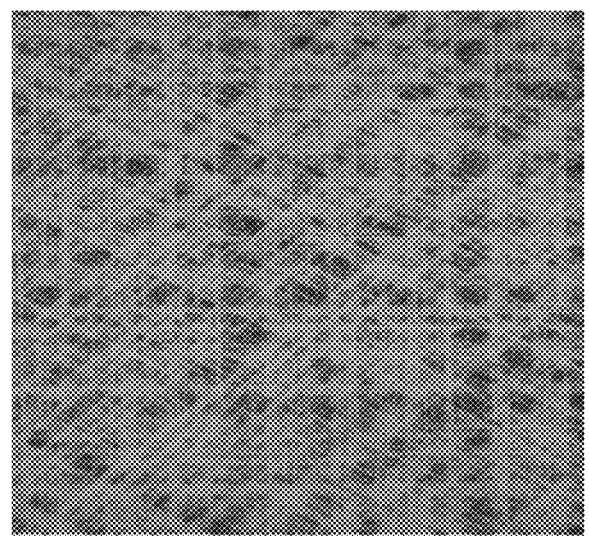
FIG. 10B is a SEM image of a substrate etched once with four intersected stacked drawn carbon nanotube films as a mask.
Figure 10C:
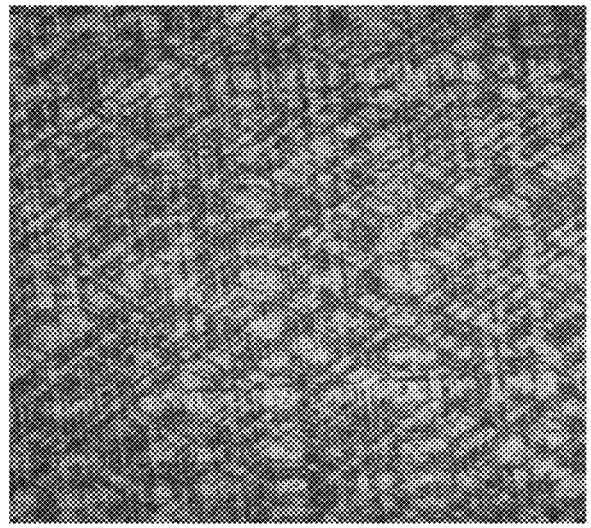
FIG. 10C is a SEM image of a substrate etched twice with two intersected stacked drawn carbon nanotube films as a mask.

The inventors of instant application find that the photocatalytic structure prepared by different intersected drawn carbon nanotube films as masks can adjust the absorption of the visible light. The nanostructures on the surface of the substrates obtained by dry etching with different intersected stacked drawn carbon nanotube films as masks are different. FIG. 10A shows a SEM image of a substrate etched once with two intersected stacked drawn carbon nanotube films as a mask. FIG. 10B shows a SEM image of a substrate etched once with four intersected stacked drawn carbon nanotube films as a mask. FIG. 10C shows a SEM image of a substrate etched twice with two intersected stacked drawn carbon nanotube films as a mask. Before the second etching, the carbon nanotube composite structure 110 rotates around the central axis perpendicular to the surface of the drawn carbon nanotube films. A rotation angle is greater than 0 degrees and less than 90 degrees. The plurality of strip-shaped bulges obtained by the first etching are broken after the second etching with the rotated carbon nanotube composite structure 110 as a mask, so that smaller and more nanostructures are formed on the surface of the substrate 12. The layers and the cross manner of the stacked drawn carbon nanotube films can affect the nanostructures on the surface of the substrates obtained by dry etching. Even if the layers are the same, different etching modes can also make different nanostructures on the surface of substrate 12. The more layers of the intersected drawn carbon nanotube films, the smaller size of the nanostructures on the surface of substrate 12.

The plurality of strip-shaped bulges 125 can have a width in a range from about 20 nanometers to about 150 nanometers, a distance in a range from about 50 nanometers to about 500 nanometers, and a height in a range from about 50 nanometers to about 1000 nanometers. In one embodiment, the plurality of strip-shaped bulges 125 have a width in a range from about 50 nanometers to about 100 nanometers, a distance in a range from about 50 nanometers to about 100 nanometers, and a height in a range from about 300 nanometers to about 1000 nanometers.

After coating with the protective layer 114, the diameter of the carbon nanotubes are about tens of nanometers, and distance between adjacent two carbon nanotubes are about tens of nanometers. Thus, the width and distance of the plurality of strip-shaped bulges 125 are also tens of nanometers, and the average size of the plurality of indents 124 are also tens of nanometers. The density of the strip-shaped bulges 125 and the indents 124 would be increased. For example, when both the width and distance of the plurality of strip-shaped bulges 125 are 50 nanometers, the number of the strip-shaped bulges 125 and the indents 124 would be 20 within 1 micrometer. The conventional photolithography method cannot make all the strip-shaped bulges in nanoscale and obtain this density due to the resolution limitation. The nanostructures can increase the specific surface area of the photocatalytic structure 10 so that the contact area between the photocatalytic structure 10 and sunlight will be enhanced, and the amount of the pollutants adsorbed on the photocatalytic structure 10 will be also increased. If the sunlight irradiates on the nanostructures of the photocatalytic structure 10, part of the sunlight can be absorbed by the nanostructures, and part of the sunlight can be reflected by the nanostructures. The sunlight reflected by the nanostructures can irradiate on the adjacent nanostructures, and a part of the reflected sunlight can be absorbed by the nanostructures. Therefore, the sunlight irradiating on the nanostructures can be reflected and absorbed many times by the nanostructures. Thus, the light utilization efficiency of photocatalytic structure 10 can be improved.

In step (S50), the method of removing the carbon nanotube composite structure 110 can be ultrasonic method, or adhesive tape peeling, oxidation. In one embodiment, the substrate 12 with the carbon nanotube composite structure 110 thereon is placed in an N-methyl pyrrolidone solution and ultrasonic vibrated for several minutes.

In step (S60), the photocatalytic active layer 13 can be deposited on both top and side surfaces of the plurality of strip-shaped bulges 125 and bottom surfaces of the plurality of indents 124. The photocatalytic active layer 13 can be formed by depositing titanium dioxide directly. The photocatalytic active layer 13 can also be formed by puttering or deposition of titanium in oxygen flow. In one embodiment, the method of forming the photocatalytic active layer 13 is atomic layer deposition (ALD). The photocatalytic structure 10 made by atomic layer deposition has higher photocatalytic efficiency because the atomic layer deposition method deposits a titanium dioxide layer with a uniform thickness and a better coverage of the substrate. Furthermore, the deposited titanium dioxide is anatase structure because the titanium dioxide is formed and deposited at a high temperature according to the present embodiment. The titanium dioxide layer can also be obtained by other methods, such as evaporation and sputtering, but annealing of the titanium dioxide layer in the air is needed to transform the titanium dioxide into anatase structure. In one embodiment, the thickness of the titanium dioxide layer is in a range from about 2 nanometers to about 600 nanometers. In another embodiment, the thickness of the titanium dioxide layer is in a range from about 15 nanometers to about 300 nanometers. In another embodiment, the thickness of the titanium dioxide layer ranges from about 20 nanometers to about 80 nanometers.

In step (S70), the metal layer pre-form 15 can be deposited on the photocatalytic active layer 13 by a method of electron beam evaporation, ion beam sputtering, atomic layer deposition, magnetron sputtering, thermal vapor deposition, or chemical vapor deposition. The thickness of the metal layer pre-form 15 ranges from about 2 nanometers to about 100 nanometers. The thickness of the metal layer pre-form 15 can also be in a range from about 5 nanometers to about 20 nanometers. In one embodiment, the thickness of the metal layer pre-form 15 is about 8 nanometers. The material of the metal layer pre-form 15 can be gold, silver, copper, iron, nickel, aluminum or alloy thereof. In one embodiment, the metal layer pre-form 15 is a gold layer with a thickness of about 8 nanometers. In one embodiment, the gold layer covers entire surfaces of the photocatalytic active layer 13.

In step (S80), the annealing is carried out in a protective gas environment. The protective gas can be nitrogen, or inert gas such as argon or the like. The annealing temperature ranges from about 200° C. to about 1000° C. In one embodiment, the annealing temperature is in a range from about 500° C. to about 800° C. The annealing time ranges from about 10 minutes to about 6 hours. In one embodiment, the annealing time ranges from about 20 minutes to about 3 hours. In another embodiment, the annealing time ranges from about 30 minutes to about 50 minutes. After annealing, the metal pre-form layer 15 on the surface of the photocatalytic active layer 13 is transformed to a plurality of nanoparticles.

In order to research the effect of the layer number of the intersected stacked drawn carbon nanotube films, the deposited metal, and the annealing treatment on the property of the photocatalytic structure, the following experiments on embodiments 1A to 1G were carried out. For referencing purposes, experiments on comparative example 1 to comparative example 3 were carried out under the same controlling conditions.

catalytic structures without any patterned bulge layer, because the patterned bulge layer 122 comprises a plurality of strip-shaped bulges intersected with each other. The spacing between the adjacent strip-shaped bulges can be adjusted, so that the resonance wavelength can be adjusted and the absorption of visible light can be improved.

Figure 15:
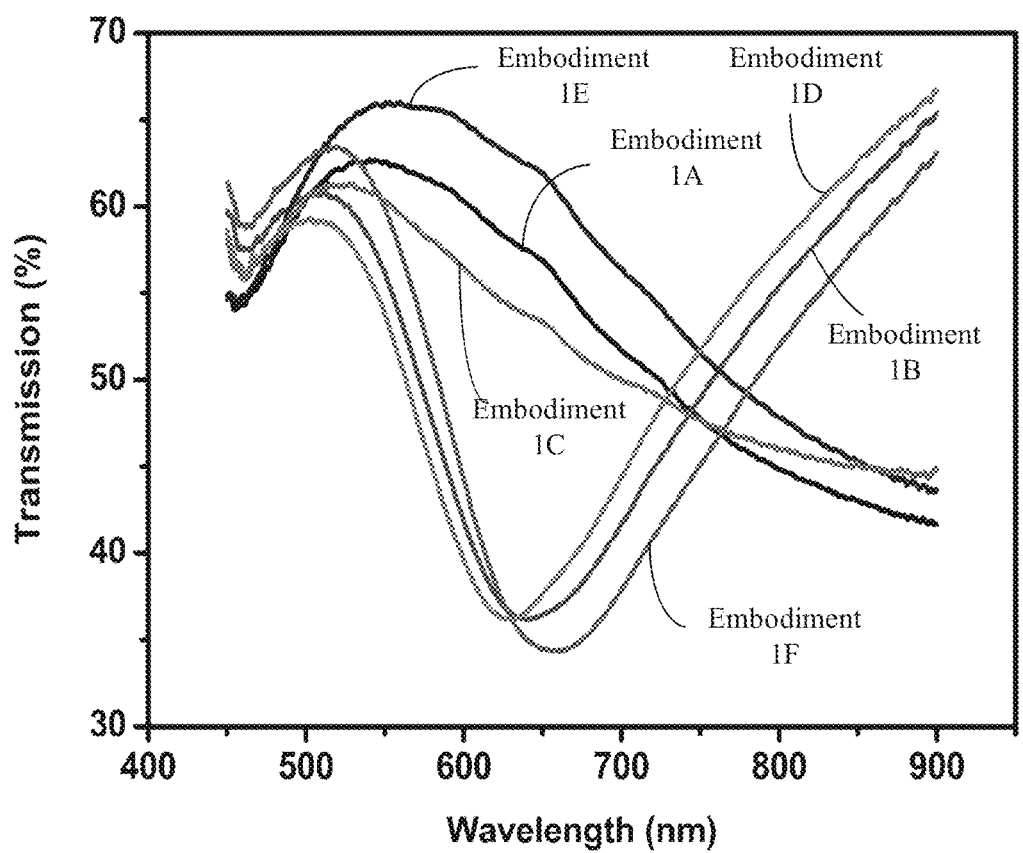
FIG. 15 shows diagrams of transmission vs. wavelength of visible light of photocatalytic structures made in embodiments 1A-1F.

Referring to FIG. 15, the visible light absorbance of the photocatalytic structure after annealing is higher than that of the photocatalytic structure without annealing treatment. Metal nanoparticles will be formed on the surface of the photocatalytic active layer 13 after annealing the metal layer pre-form 15. Because of the localized surface plasmon resonance (LSPR), electric filed intensity on the surface of the metal nanoparticles is increased. The localized surface plasmon resonance of the metal nanoparticles can be formed at certain wavelengths, so that the metal nanoparticles can achieve broadband absorption.

The inventors of instant application find that the photocatalytic structure prepared by different intersected drawn carbon nanotube films as masks can adjust the absorption of the visible light. The nanostructures on the surface of the substrates obtained by dry etching with different intersected drawn carbon nanotube films as masks are different. The photocatalytic structure with the substrate etched once with two intersected stacked drawn carbon nanotube films as a mask has little difference in visible light absorption from that of the photocatalytic structure with substrate etched twice with two intersected stacked drawn carbon nanotube films as a mask. The maximum absorbance of visible light occurs at

TABLE 2

Different conditions for making photocatalytic structure in embodiments 1A to 1G and comparative examples 1 to 3

| Embodiments | Type of substrate | Layer number of intersected stacked drawn carbon nanotube films | Echting time | Type of deposited metals | Annealing or not |
| --- | --- | --- | --- | --- | --- |
| 1A | Structure | 2 | 1 | Au | No |
| 1B | Structure | 2 | 1 | Au | Yes |
| 1C | Structure | 2 | 2 | Au | No |
| 1D | Structure | 2 | 2 | Au | Yes |
| 1E | Structure | 4 | 1 | Au | No |
| 1F | Structure | 4 | 1 | Au | Yes |
| 1G | Structure | 2 | 1 | Ag | Yes |
| Comparative example 1 | Pure | 0 | 0 | No deposited metal | Yes |
| Comparative example 2 | Structure | 2 | 1 | No deposited metal | Yes |
| Comparative example 3 | Pure | 0 | 0 | Au | Yes |

Figure 14:
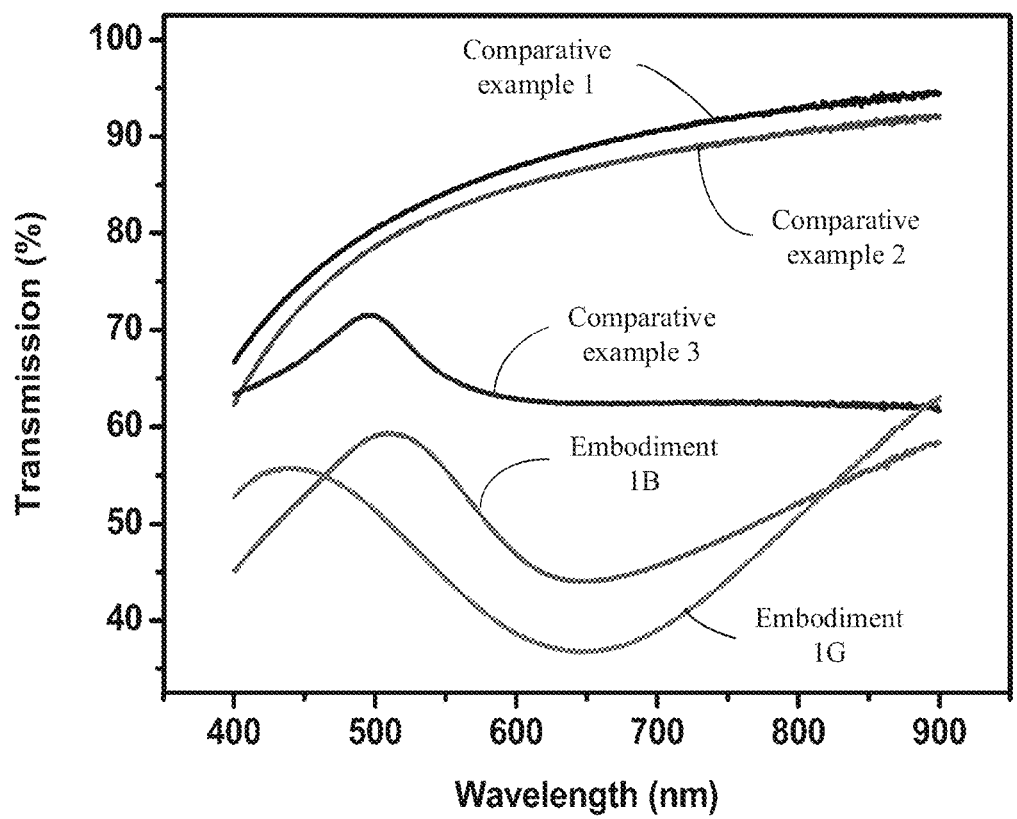
FIG. 14 shows diagrams of transmission vs. wavelength of visible light of photocatalytic structures made in embodiments 1B, 1G, and comparative examples 1-3.

The structured substrate refers that the substrate 12 comprises a base 120 and a patterned bulge layer 122 on a surface of the base 120. The pure substrate refers that the substrate 12 has no patterned bulge layer 122 on a surface of the base 120. Referring to FIG. 11-FIG. 13, atomic force microscope (AFM) images of the photocatalytic structure made by embodiment 1B, embodiment 1D, and embodiment 1F are provided. The transmission spectra of visible light for the photocatalytic structures prepared in embodiments 1A-1G and comparative examples 1-3 is also provided. Referring to FIG. 14, it is found that the visible light transmission of the photocatalytic structures with the patterned bulge layer is generally lower than that of photocatalytic structures without any patterned bulge layer. The visible light absorbance of the photocatalytic structures with the patterned bulge layer is higher than that of the photo- 633 nanometer wavelength. The maximum absorbance of visible light of the photocatalytic structure with substrate etched once with four intersected stacked drawn carbon nanotube films as a mask occurs at 660 nanometer wavelength. The absorbance can be 67%. The layers and the cross manner of the stacked drawn carbon nanotube films can affect the nanostructures on the surface of the substrates obtained by dry etching, so that the visible light absorbance of the photocatalytic structure 10 in a specific band can be maximized. It is not that the more the layers of the stacked drawn carbon nanotube films, the better the property of the photocatalytic structure. When the layers are more than 4, the substrate can not be etched easily because more layers make the micro pore size smaller. The photocatalytic effect of the photocatalytic structure prepared by more than four intersected stacked drawn carbon nanotube films as a mask becomes worse than the photocatalytic effect of the photocatalytic structure prepared by four intersected stacked drawn carbon nanotube films as a mask.

Figure 16A:
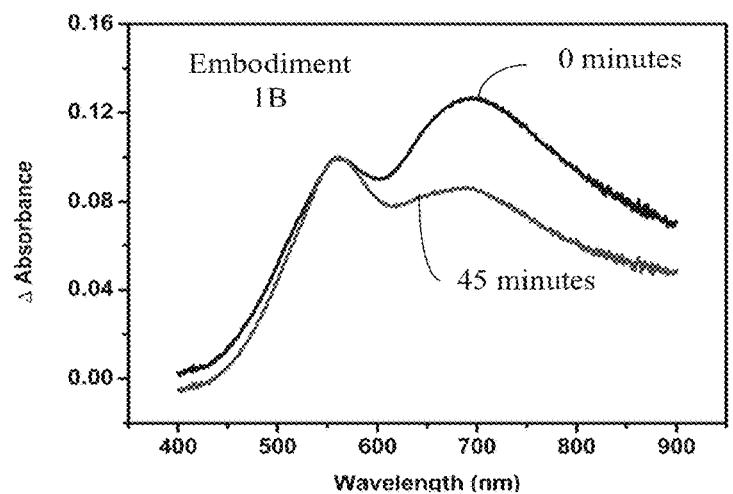
FIG. 16A shows diagrams of absorbance vs. wavelength of the photocatalytic structure of FIG. 11 for the visible light at different length time.
Figure 16B:
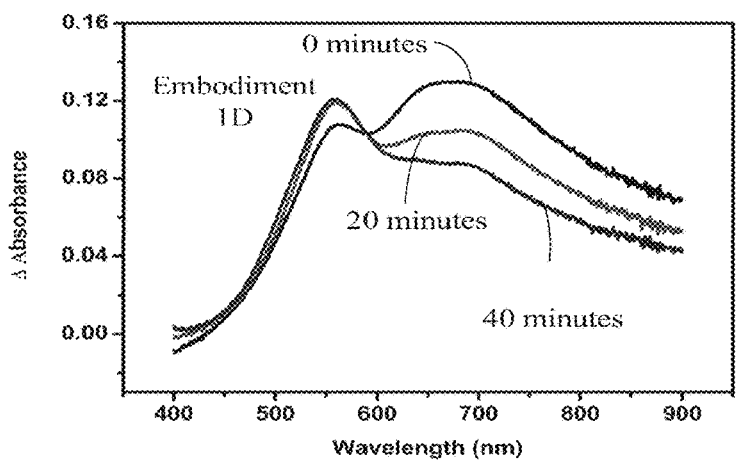
FIG. 16B shows diagrams of absorbance vs. wavelength of the photocatalytic structure of FIG. 12 for the visible light at different length time.
Figure 16C:
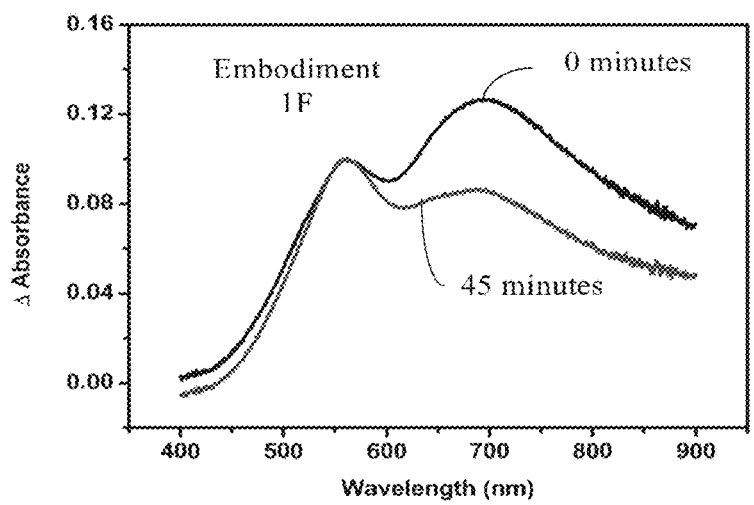
FIG. 16C shows diagrams of absorbance vs. wavelength of the photocatalytic structure of FIG. 13 for the visible light at different length time.
Figure 17A:
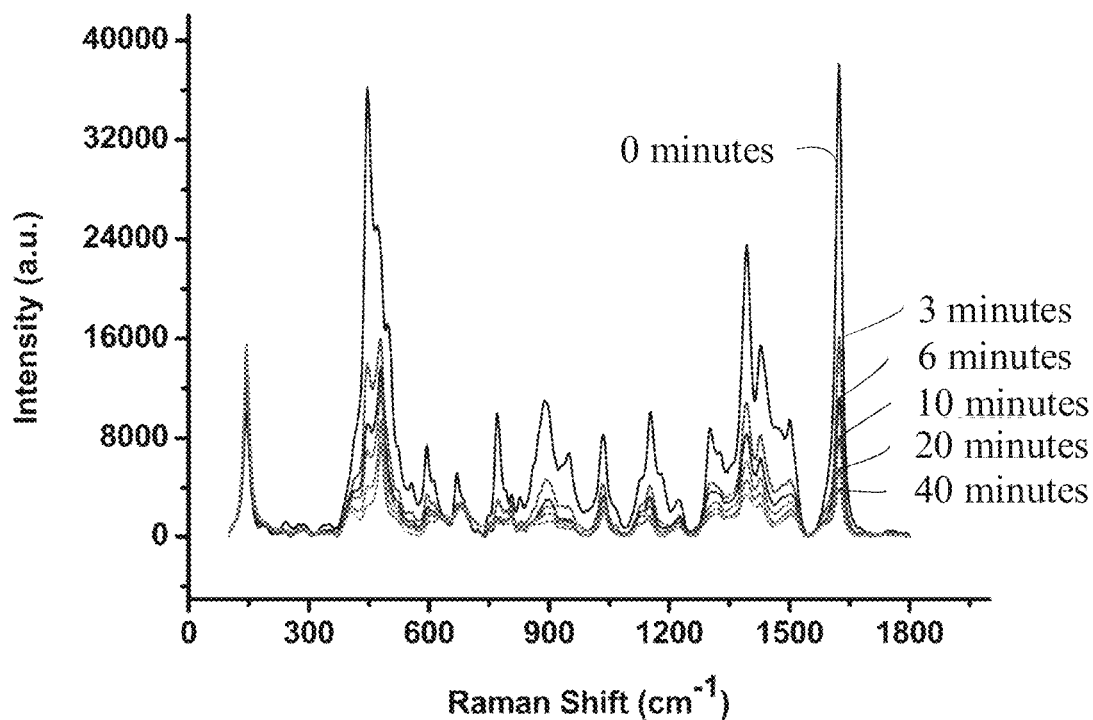
FIG. 17A is a Raman spectroscopy of MB molecules on the photocatalytic structure of FIG. 11 irradiated with a 633 nm laser at different length time.
Figure 17B:
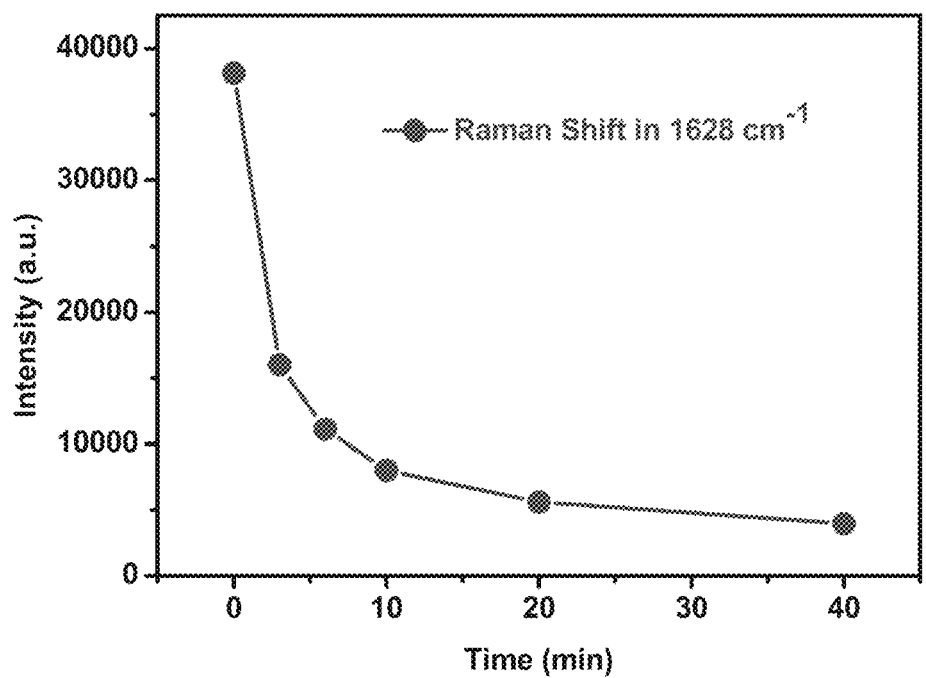
FIG. 17B is a diagram of intensity of Raman peak in 1628 $cm^{-1}$ vs. time at time points of FIG. 17A.

The performance of photocatalytic structures prepared by embodiments 1B, 1D and 1F was tested with methylene blue (MB). 10 mM MB is spin coated on a surface of metal layer 14 of the photocatalytic structure 10, wherein the rotation speed can be about 2000 rpm, and the spin time can be about 60 seconds. Simulated sunlight is supplied to the MB to produce an absorption spectrum. Referring to FIG. 16, the intensity of characteristic peaks of MB molecules was reduced after simulated sunlight irradiation of 45 minutes, which indicated that the photocatalytic structures prepared by embodiments 1B, 1D and 1F had high catalytic effect under simulated sunlight, and the utilization of visible light is improved. Referring to FIG. 17A and FIG. 17B, Raman spectroscopies of MB molecules is provided. A laser irradiation of 633 nanometers is supplied to the MB molecules by a Raman detection system to produce a Raman spectroscopy. The intensity of characteristic peaks of MB molecules was reduced over time, which indicates that the amount of MB molecules decreased as the MB molecules decompose under visible laser irradiation. FIG. 17B is a diagram of the intensity of Raman peak in 1628 $cm^{-1}$ of MB molecules over time. The intensity of the Raman peak in 1628 $cm^{-1}$ was reduced, which demonstrates that photocatalytic structure has good photocatalytic effect under 633 nanometers visible light irradiation. The photocatalytic structure can improve the photocatalytic response and utilization under visible light.

The photocatalytic structure 10 as disclosed has the following characteristics. Firstly, the photocatalytic active layer 13 is located on the surface of patterned bulge layer 122 comprising a plurality of strip-shaped bulges intersected with each other, so the specific surface area can be increased and the adsorption capacity of the reactants can be enhanced. Secondly, metal surface plasma resonance absorption will occur under the excitation of incident photoelectric magnetic field. The thermal electrons generated by the metal layer 14 due to the local surface plasmon resonance effect can be released onto the conduction band of the photocatalytic active layer 13. Surface plasmon resonance effect can inhibit the recombination rate of electron-hole pairs and increase the number of active electrons through the transfer of energy or charge carriers. The absorbance and utilization of light can be improved. Thirdly, the nanostructure of photocatalytic structure 10 and the resonance absorption wavelength and absorption intensity of the metal layer 14 to visible light can be controlled by adjusting the layer number and the intersecting and stacking manners of the drawn carbon nanotube films in carbon nanotube structure 112. Experiment results according to embodiments of the present application show that the absorbance of visible light and the catalytic effect of titanium dioxide in certain wavelength can be greatly improved.

Figure 18:
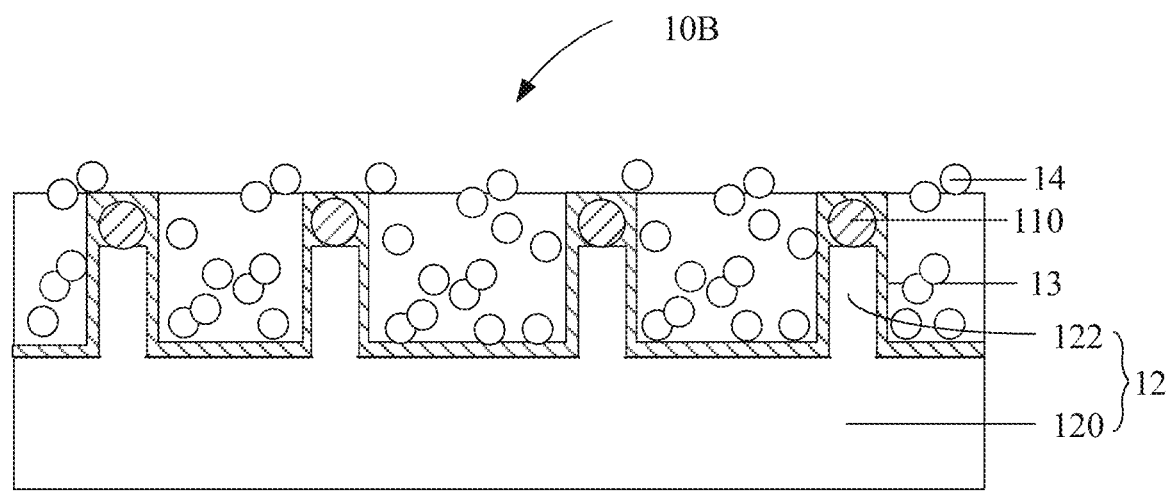
FIG. 18 is a schematic section view of another embodiment of a photocatalytic structure.

Referring to FIG. 18, a photocatalytic structure 10B of another embodiment is disclosed. The photocatalytic structure 10B comprises a substrate 12, a carbon nanotube composite structure 110, a photocatalytic active layer 13, and a metal layer 14. The substrate 12 comprises a base 120 and a patterned bulge layer 122 on a surface of the base 120. The patterned bulge layer 122 is a net-like structure comprising a plurality of strip-shaped bulges 125 intersected with each other and a plurality of indents 124 defined by the plurality of strip-shaped bulges 125. The plurality of strip-shaped bulges 125 is an integrated structure. The carbon nanotube composite structure 110 is located between the patterned bulge layer 122 and the photocatalytic active layer 13.

The photocatalytic structure 10B is similar to the photocatalytic structure 10 above except that the photocatalytic structure 10B further comprises a carbon nanotube composite structure 110 located between the patterned bulge layer 122 and the photocatalytic active layer 13. The photocatalytic active layer 13 entirely covers both the patterned bulge layer 122 and the carbon nanotube composite structure 110. The carbon nanotube composite structure 110 is on the top surface of the plurality of strip-shaped bulges 125 opposite to the plurality of indents 124.

Figure 19:
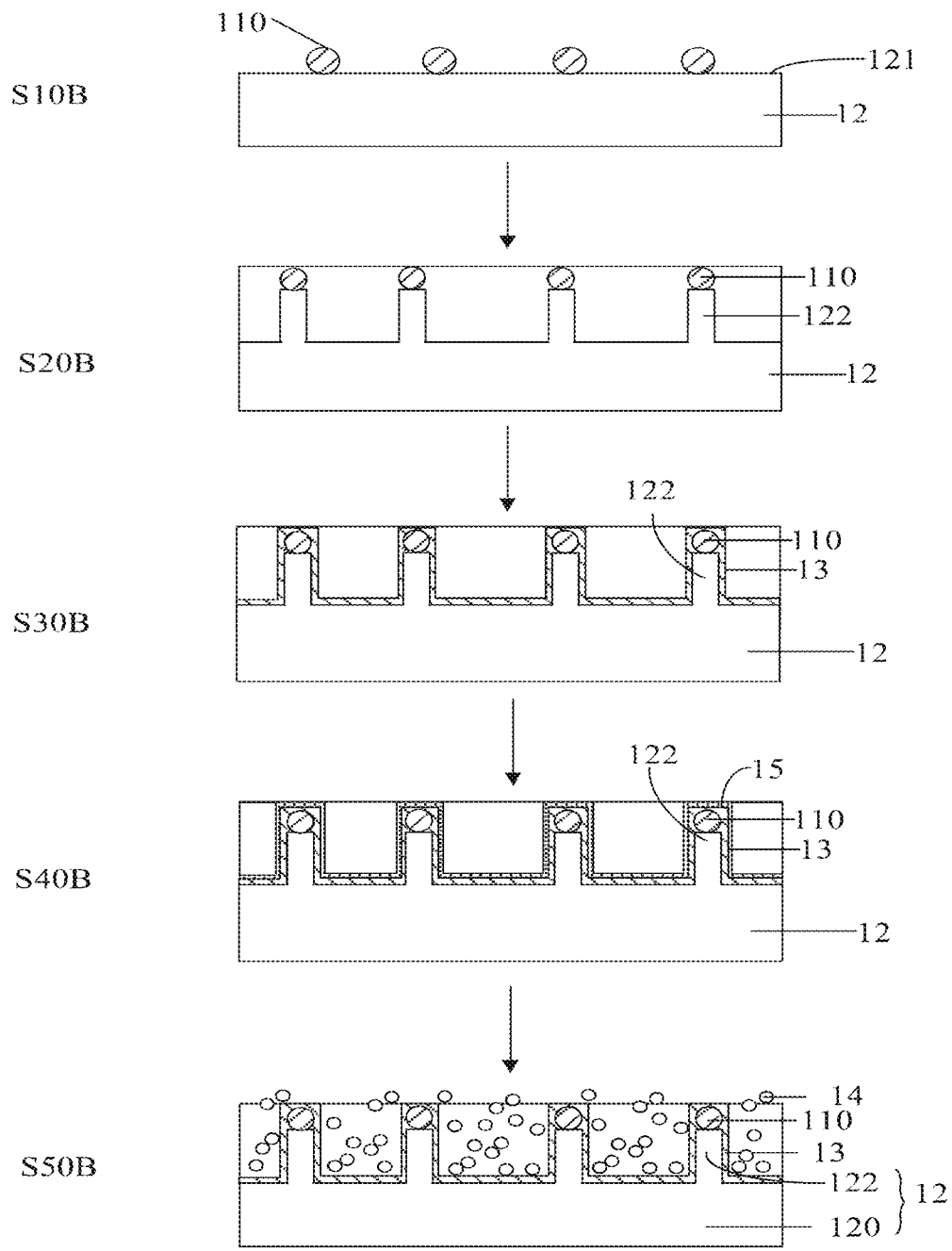
FIG. 19 is a flowchart of another embodiment of a method for making the photocatalytic structure of FIG. 18.

Referring to FIG. 19, a method for making the photocatalytic structure 10B of one embodiment includes the following steps:

step (S10B), placing the carbon nanotube composite structure 110 on a surface 121 of the substrate 12, wherein parts of the surface 121 are exposed from the plurality of openings 116;

step (S20B), forming the patterned bulge layer 122 on the surface 121 by dry etching the surface 121 using the carbon nanotube composite structure 110 as a mask, wherein the patterned bulge layer 122 includes a plurality of strip-shaped bulges 125 intersected with each other;

step (S30B), applying the photocatalytic active layer 13 on the patterned bulge layer 122 so that the photocatalytic active layer 13 entirely covers both the patterned bulge layer 122 and the carbon nanotube composite structure 110;

step (S40B), applying a metal layer pre-form 15 on the surface of the photocatalytic active layer 13 away from the substrate 12; and step (S50B), forming the metal layer 14 by annealing the metal layer pre-form 15.

The method for making the photocatalytic structure 10B is similar to the method for making the photocatalytic structure 10 above except the step (S50) is omitted.

The carbon nanotube composite structure 110 and the patterned bulge layer 122 can form two layer of nano-scaled structure having the same pattern. The carbon nanotube composite structure 110 can further enhance the roughness of the top surfaces of the patterned bulge layer 122. Thus, the absorbance of the light and the photocatalytic effect will be further improved. Furthermore, the method for making the photocatalytic structure 10B would have a relatively lower cost and relatively higher efficiency, and cause less pollution because the step (S50) of removing the carbon nanotube composite structure 110 is omitted.

Figure 20:
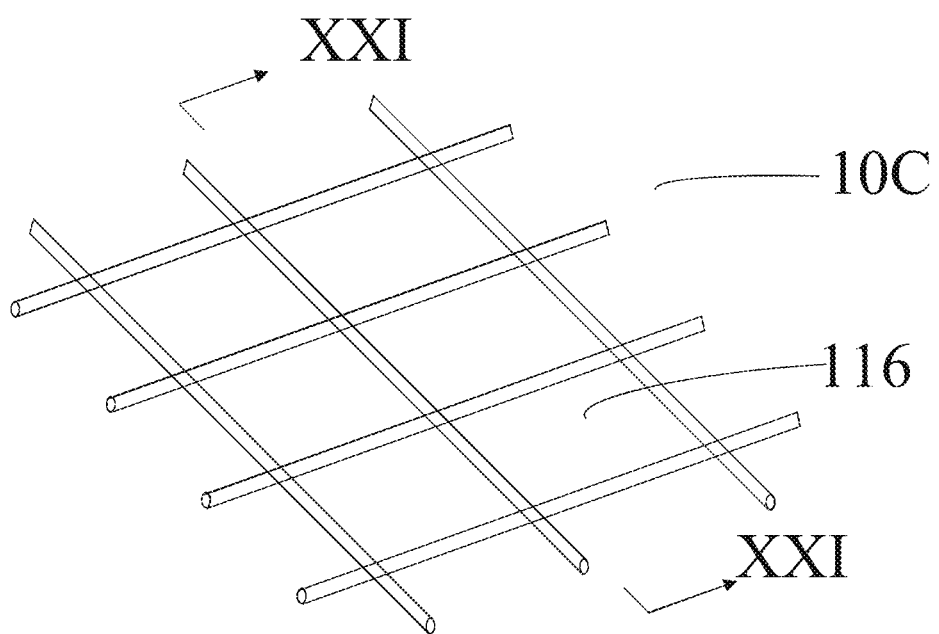
FIG. 20 is a schematic section view of another embodiment of a photocatalytic structure.
Figure 21:
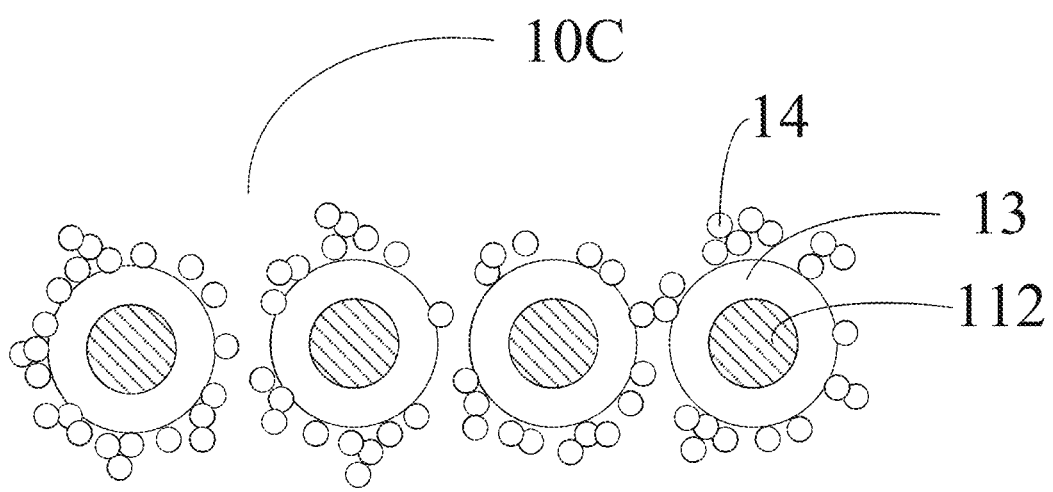
FIG. 21 is a cross-sectional view, along a line XXI-XXI of FIG. 20.

Referring to FIG. 20 and FIG. 21, a photocatalytic structure 10C of another embodiment is provided. The photocatalytic structure 10C comprises a carbon nanotube structure 112, a photocatalytic active layer 13 coated on the carbon nanotube structure 112, and a metal layer 14 coated on the photocatalytic active layer 13. The carbon nanotube structure 112 comprises a plurality of intersected carbon nanotubes and defines a plurality of openings 116. The photocatalytic active layer 13 is coated on the surface of the plurality of carbon nanotubes.

The metal layer 14 comprises a plurality of nanoparticles on the surface of the photocatalytic active layer 13. The thickness of the photocatalytic structure 10C is micro-nano meters scale. The sizes of the plurality of openings are also micro-nano meters. The size of of the plurality of openings is a maximum diagonal length of the hole or width of the gap. In one embodiment, the thickness of the photocatalytic structure 10C is in a range from 50 nanometers to 300 micrometers, and the sizes of the plurality of openings 116 are in a range from 1 nanometer to 0.5 micrometers.

Figure 22:
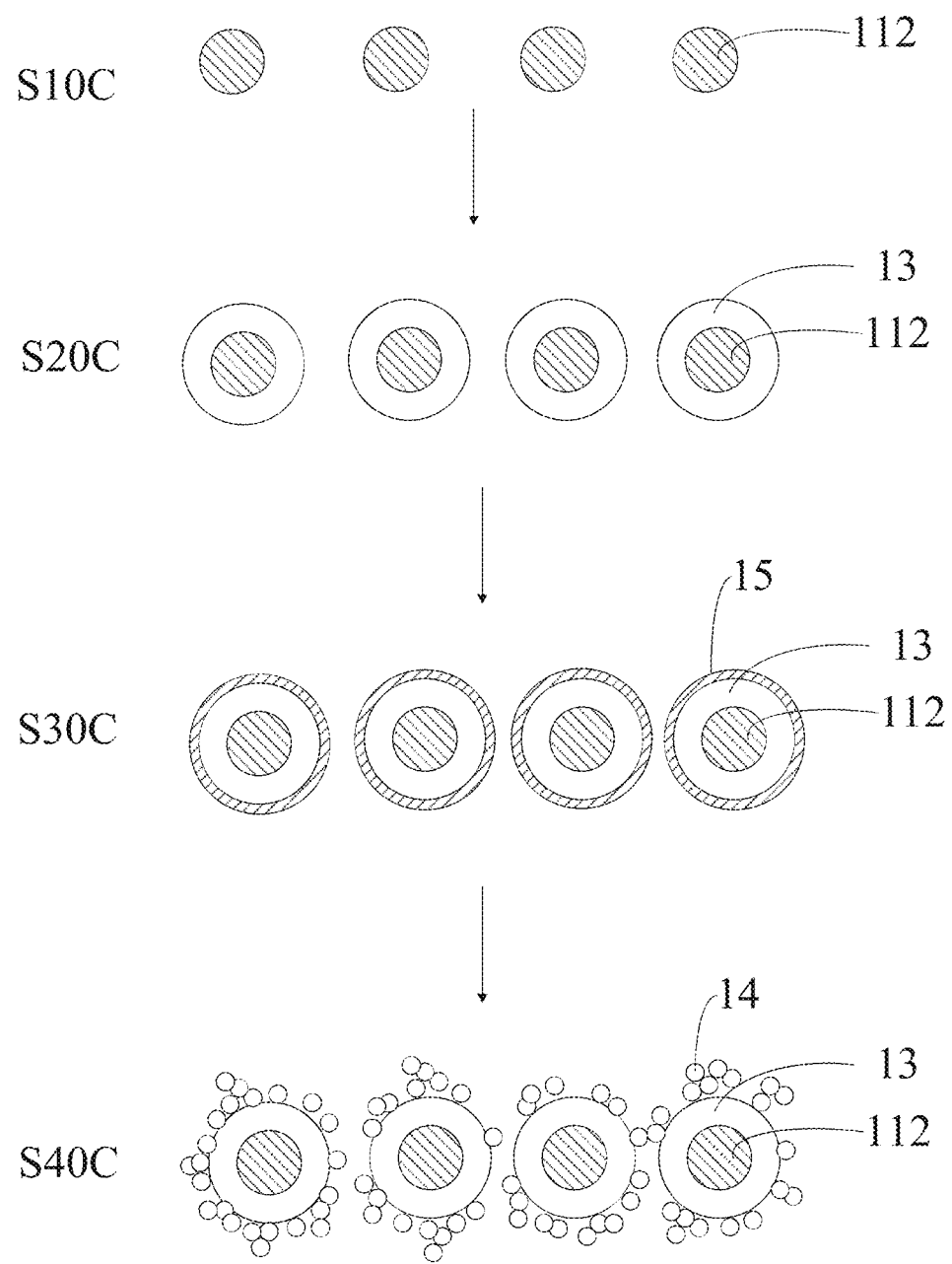
FIG. 22 is a flowchart of another embodiment of a method for making the photocatalytic structure of FIG. 20.

Referring to FIG. 22, a method for making the photocatalytic structure 10C of one embodiment includes the following steps:

step (S10C), providing a carbon nanotube structure 112, wherein the carbon nanotube structure 112 includes a plurality of intersected carbon nanotubes and defines a plurality of openings 116 step (S20C), forming the photocatalytic active layer 13 on the surface of the carbon nanotube structure 112;

step (S30C), applying a metal layer pre-form 15 on the surface of the photocatalytic active layer 13; and step (S40C), forming the metal layer 14 by annealing the metal layer pre-form 15.

In step (S10C), the carbon nanotube structure 112 comprises at least two intersected stacked drawn carbon nanotube films. The alignment direction of carbon nanotubes in any two carbon nanotube films has an angle of β, and the angle β is greater than 0 degrees and less than or equal to 90 degrees. Therefore, a plurality of opening 116 is defined. The sizes of the plurality of opening 116 range from 1 nanometer to 0.5 micrometers.

In step (20C), the thickness of the photocatalytic active layer 13 ranges from about 2 nanometers to about 600 nanometers. In one embodiment, the thickness of the photocatalytic active layer 13 ranges from about 25 nanometers to about 100 nanometers.

Two methods of forming the photocatalytic active layer 13 are disclosed as follows:

One of the methods of making the photocatalytic active layer 13 is to deposit a layer of titanium dioxide on the surface of the carbon nanotube structure 112 by atomic layer deposition. Another method of making the photocatalytic active layer 13 is to sputter or deposit a titanium layer on the surface of the carbon nanotube structure 112. During the sputtering process, oxygen flow is introduced and the titanium oxide layer is oxidized to obtain titanium dioxide.

The photocatalytic structure 10C has a great absorption of light in the wavelength range from 200 nm to 400 nm, and the absorbance can be up to about 93%. The inventors of instant application find that the photocatalytic structure 10C including different intersected drawn carbon nanotube films as carrier can adjust the absorption of the visible light.

TABLE 3

Different conditions for making photocatalytic structure in embodiments 3A to 3D and comparative examples 4 to 7

| Embodiments | Layer number of intersected stacked drawn carbon nanotube films | Type of deposited metals |
|---|---|---|
| 3A | 1 | Ag |
| 3B | 2 | Ag |
| 3C | 3 | Ag |
| 3D | 4 | Ag |
| Comparative example 4 | 1 | No deposited metal |
| Comparative example 5 | 2 | No deposited metal |
| Comparative example 6 | 3 | No deposited metal |
| Comparative example 7 | 4 | No deposited metal |

Figure 23:
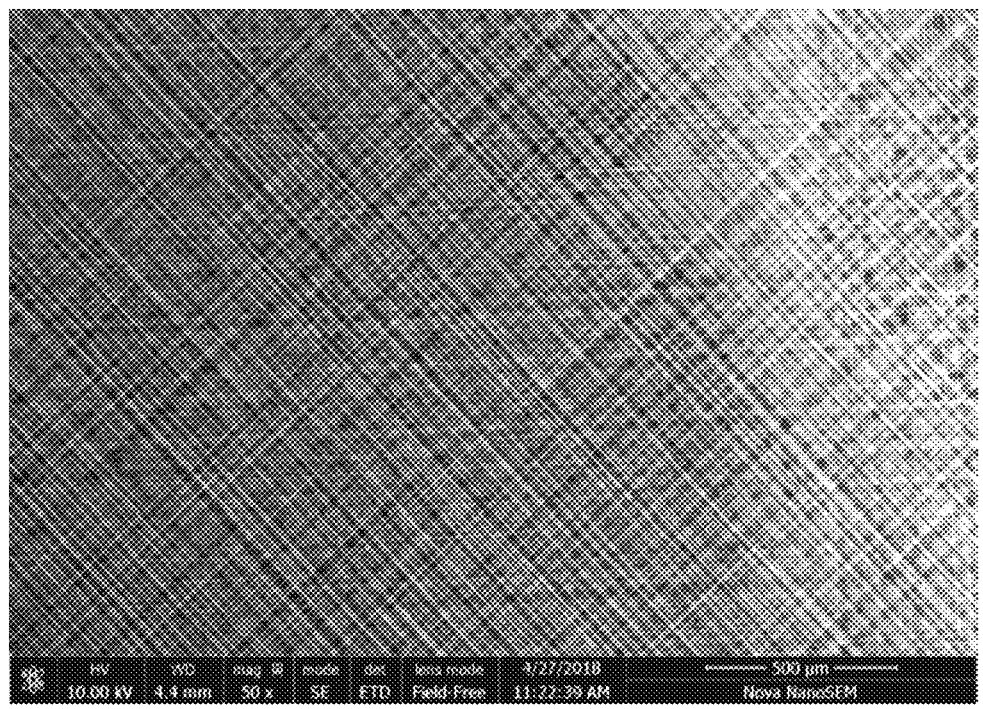
FIG. 23 is a SEM image of four intersected stacked drawn carbon nanotube films.
Figure 24A:
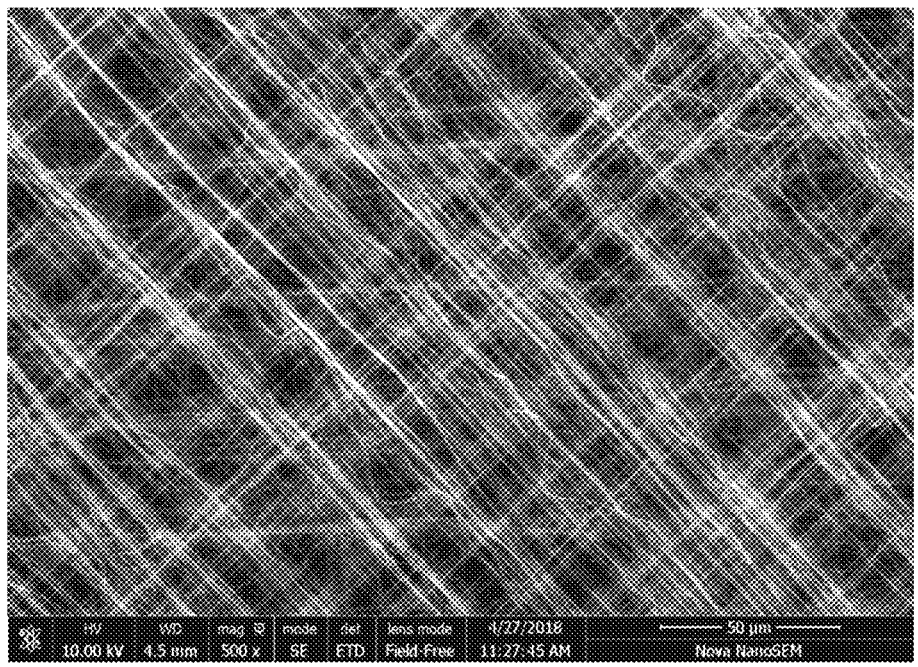
FIG. 24A is a SEM image of the photocatalytic structure with four intersected stacked drawn carbon nanotube films as a carrier.
Figure 24B:
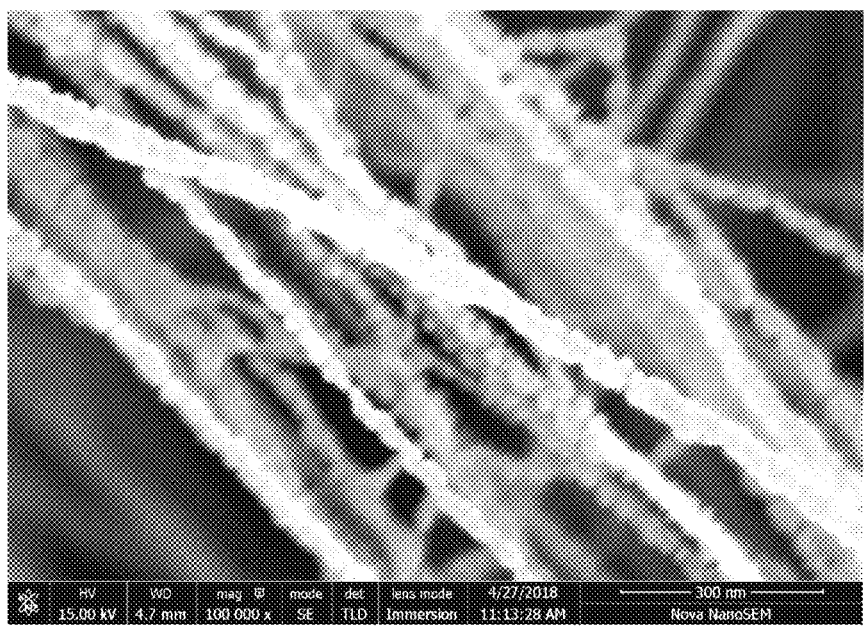
FIG. 24B a partial enlargement of the photocatalytic structure of FIG. 24A.
Figure 25A:
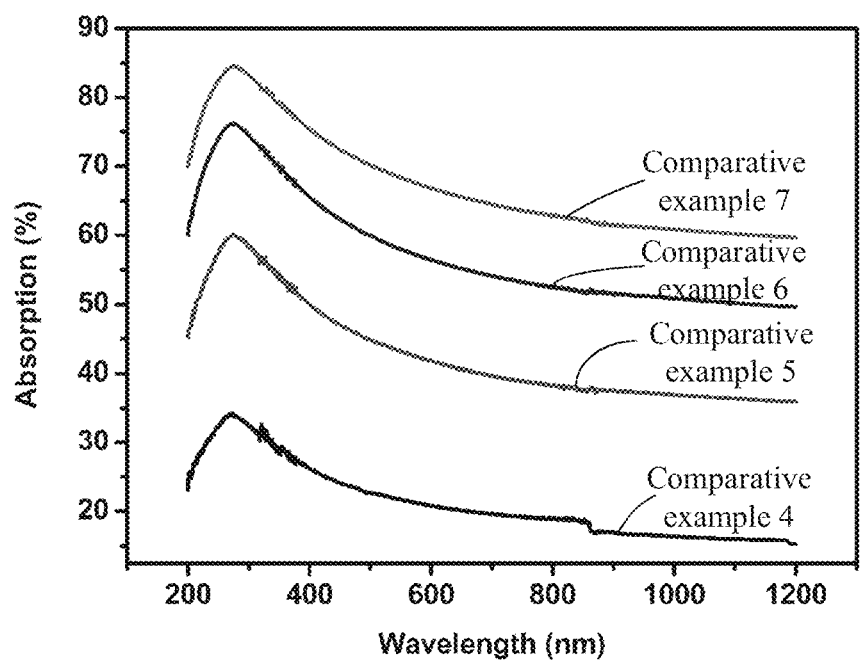
FIG. 25A shows diagrams of transmission vs. wavelength of ultraviolet-visible light of photocatalytic structures made in comparative examples 4-7.
Figure 25B:
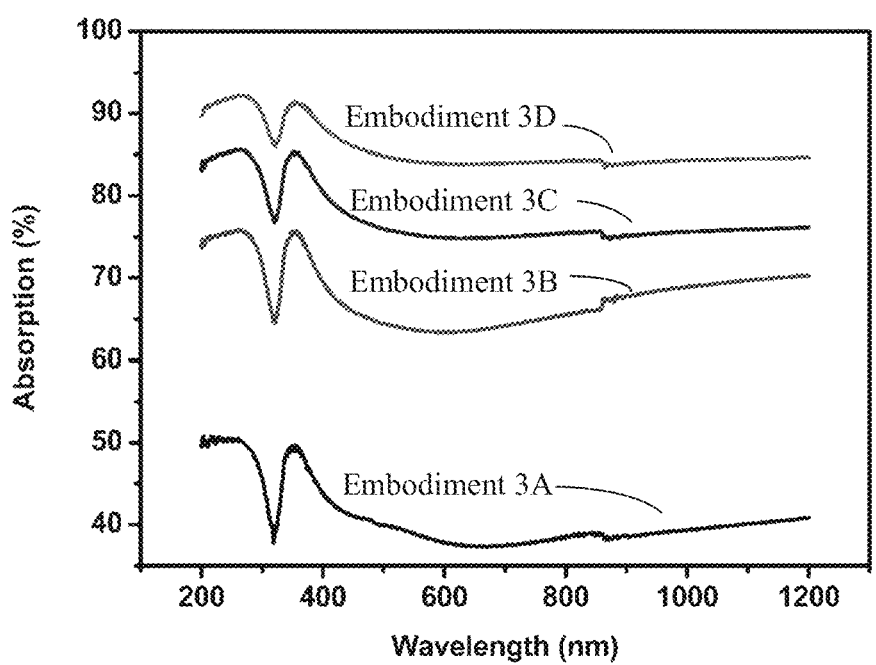
FIG. 25B shows diagrams of transmission vs. wavelength of ultraviolet-visible light of photocatalytic structures made in embodiments 3A-3D.

An angle between the aligned directions of the carbon nanotubes in two adjacent stacked drawn carbon nanotube films is less than 0 degrees and larger than or equal to 90 degrees. The aligned directions of the carbon nanotubes in any two drawn carbon nanotube films are different. In one embodiment, the carbon nanotube structure 112 includes two intersected stacked drawn carbon nanotube films. The angle between the aligned directions of the carbon nanotubes in the two adjacent stacked drawn carbon nanotube films is about 90 degrees. In another embodiment, the carbon nanotube structure 112 includes four intersected stacked drawn carbon nanotube films. The angle between the aligned directions of the carbon nanotubes in any two adjacent stacked drawn carbon nanotube films is about 45 degrees and the aligned directions of the carbon nanotubes in any two drawn carbon nanotube films are different from each other. Referring to FIG. 23 and FIG. 24, scanning electron microscope (SEM) images of the carbon nanotube structure 112 including four intersected stacked drawn carbon nanotube films and the photocatalytic structure made by embodiment 3D are provided. FIG. 24B is a partially enlarged view of FIG. 24A. The transmission spectra of visible light for the photocatalytic structures prepared in embodiments 3A-3D and comparative examples 4-7 is also provided. Referring to FIG. 25, experimental results show that the light absorbance of the photocatalytic structure after annealing is higher than that of the corresponding photocatalytic structure without annealing treatment, regardless of the number of the layers of the intersected stacked drawn carbon nanotube films. The maximum light absorbance of the photocatalytic structure without annealing treatment only occurs at 280 nanometer wavelength. The photocatalytic structure deposited metal layer has stronger absorption in broadband. Larger resonance absorption of the photocatalytic structure occurs at 360 nanometer wavelength. With the increase of the layer number of intersected stacked drawn carbon nanotube films, the absorption ability of the light near 360 nanometer wavelength is enhanced. The maximum absorbance of the photocatalytic structure with four intersected stacked drawn carbon nanotube films can reach 93%, which indicates that the utilization of ultraviolet light has been improved.

The photocatalytic structure 10C as disclosed has the following characteristics. Firstly, it is convenient to recycle the photocatalytic structure 10C to reduce secondary pollution because the carbon nanotube structure 112 acts as the carrier. Secondly, photocatalytic reaction can be carried out on both surfaces of photocatalytic structure 10C, so the specific surface area of the photocatalytic structure 10C for photocatalytic reaction can be increased, and the utilization rate and catalytic effect of the photocatalytic structure 10C can also be improved. Thirdly, the nanostructure of photocatalytic structure 10C and the resonance absorption wavelength and absorption intensity of the metal layer 14 to solar light can be controlled by adjusting the number of layers and the manners of intersecting and stacking of the drawn carbon nanotube films in carbon nanotube structure 112. The absorbance of ultraviolet light and the catalytic effect of titanium dioxide in ultraviolet wavelength can be greatly improved. Fourthly, various photocatalytic structures with different characteristics can be prepared by placing the carbon nanotube composite structure on different substrates. When the material of the substrate is metal, the photocatalytic structure can be used as working electrode of photoelectrocatalytic structure. The working electrode, a counter electrode, and a reference electrode can be assembled into a photoelectrocatalytic reactor.

It is to be understood that the above-described embodiments are intended to illustrate rather than limit the disclosure.

Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A photocatalytic structure comprising:
   a substrate;
   a photocatalytic active layer directly located on and being in contact with the substrate; and
   a metal layer on a surface of the photocatalytic active layer away from the substrate;
   wherein the substrate consists of a base and a patterned bulge layer on a surface of the base, the patterned bulge layer is a net-like structure comprising a plurality of strip-shaped bulges intersecting with each other and a plurality of indents are defined by the plurality of strip-shaped bulges, the patterned bulge layer and the base are an integrated structure and made of a same material, and a material of the substrate is polyethylene terephthalate, polyimide, polymethyl methacrylate, polydimethylsiloxane, or polyethylene naphthalate; the photocatalytic active layer is on a surface of the patterned bulge layer, and the photocatalytic active layer covers both the plurality of strip-shaped bulges and the plurality of indents; and the metal layer consists of a plurality of nanoparticles on a surface of the photocatalytic active layer away from the substrate.

2. The photocatalytic structure of claim 1, wherein the plurality of strip-shaped bulges comprises a plurality of first strip-shaped bulges and a plurality of second strip-shaped bulges, the plurality of first strip-shaped bulges are substantially parallel with each other and extends along a first direction, and the plurality of second strip-shaped bulges are substantially parallel with each other and extends along a second direction, the second direction being different from the first direction.

3. The photocatalytic structure of claim 2, wherein an angle between the first direction and the second direction is greater than 30 degrees and less than or equal to 90 degrees.

4. The photocatalytic structure of claim 1, wherein a width of each of the plurality of strip-shaped bulges is in a range from approximately 20 nanometers to approximately 150 nanometers, a height of each of the plurality of strip-shaped bulges is in a range from approximately 50 nanometers to approximately 2000 nanometers, and a distance between adjacent two of the plurality of strip-shaped bulges is in a range from approximately 50 nanometers to approximately 500 nanometers.

5. The photocatalytic structure of claim 1, wherein the metal layer comprises a material selected from the group consisting of gold, silver, copper, iron, nickel, aluminum, and alloy thereof.

6. The photocatalytic structure of claim 1, wherein the metal layer covers an entire surface of the photocatalytic active layer.

7. The photocatalytic structure of claim 1, further comprising a carbon nanotube composite structure between the photocatalytic active layer and the patterned bulge layer.

8. The photocatalytic structure of claim 7, wherein the carbon nanotube composite structure is on top surfaces of the plurality of strip-shaped bulges opposite to the plurality of indents.

9. The photocatalytic structure of claim 7, wherein the patterned bulge layer defines a pattern corresponding to a shape of the carbon nanotube composite structure.

10. The photocatalytic structure of claim 7, wherein the carbon nanotube composite structure comprises a carbon nanotube structure and a protective layer coated on the carbon nanotube structure, and the carbon nanotube structure comprises a plurality of carbon nanotubes intersected with each other.

11. The photocatalytic structure of claim 10, wherein the protective layer comprises a material selected from the group consisting of metal, metal oxide, metal nitride, metal carbide, metal sulfide, silicon oxide, silicon nitride, and silicon carbide.

12. The photocatalytic structure of claim 10, wherein the carbon nanotube structure comprises first carbon nanotube film and a second carbon nanotube film stacked with each other, the first carbon nanotube film comprises a plurality of first carbon nanotubes joined end to end and arranged along a third direction, and the second carbon nanotube film comprises a plurality of second carbon nanotubes joined end to end and arranged along a fourth direction, the fourth direction being different from the third direction.

13. The photocatalytic structure of claim 10, wherein the thickness of the protective layer is in a range from about 3 nanometers to about 20 nanometers.

14. The photocatalytic structure of claim 1, wherein the photocatalytic active layer is on both top and side surfaces of the plurality of strip-shaped bulges and bottom surfaces of the plurality of indents.

15. The photocatalytic structure of claim 1, wherein a material of the photocatalytic active layer is anatase titanium dioxide.

16. The photocatalytic structure of claim 1, wherein a ratio between a depth of each of the plurality of strip-shaped bulges and a average size of the plurality of indents is greater than 5.

17. A photocatalytic structure consisting of:
   a substrate;
   a photocatalytic active layer directly located on and being in contact with the substrate; and
   a metal layer located on a surface of the photocatalytic active layer away from the substrate;
   wherein the substrate consists of a base and a patterned bulge layer on a surface of the base, the patterned bulge layer is a net-like structure comprising a plurality of strip-shaped bulges intersecting with each other and a plurality of indents are defined by the plurality of strip-shaped bulges, the patterned bulge layer and the base are an integrated structure and made of a same material, and a material of the substrate is polyethylene terephthalate, polyimide, polymethyl methacrylate, polydimethylsiloxane, or polyethylene naphthalate; the photocatalytic active layer is located on a surface of the patterned bulge layer, and the metal layer consists of a plurality of nanoparticles on a surface of the photocatalytic active layer away from the substrate.

* * * * *